United States Patent
Tani et al.

(10) Patent No.: US 6,459,640 B1
(45) Date of Patent: Oct. 1, 2002

(54) NONVOLATILE SEMICONDUCTOR MEMORY AND AUTOMATIC ERASING/WRITING METHOD THEREOF

(75) Inventors: Kunio Tani, Tokyo (JP); Tomohisa Iba, Tokyo (JP); Tetsu Tashiro, Tokyo (JP); Katsunobu Hongo, Tokyo (JP); Tsutomu Tanaka, Tokyo (JP); Mikio Kamiya, Tokyo (JP); Toshihiro Sezaki, Tokyo (JP); Hiroyuki Kimura, Tokyo (JP)

(73) Assignees: Mitsubishi Denki Kabushiki Kaisha, Tokyo (JP); Mitsubishi Electric Engineering Comp. Limited, Tokyo (JP); Mitsubishi Electric Semiconductor System Corp., Tokyo (JP)

( * ) Notice: Subject to any disclaimer, the term of this patent is extended or adjusted under 35 U.S.C. 154(b) by 0 days.

(21) Appl. No.: 09/931,243

(22) Filed: Aug. 17, 2001

(30) Foreign Application Priority Data

Feb. 1, 2001 (JP) .......................................... 2001-026030

(51) Int. Cl.$^7$ ................................................ G11C 7/00
(52) U.S. Cl. ............. 365/218; 365/185.29; 365/189.04; 365/230.06
(58) Field of Search ........................... 365/185.29, 218, 365/200, 230.03, 230.06, 240, 189.04

(56) References Cited

U.S. PATENT DOCUMENTS 5,267,218 A * 11/1993 Elbert .................... 365/185.04
5,339,279 A * 8/1994 Toms et al. ............. 365/185.11
5,978,305 A * 11/1999 Sasaki et al. ........... 365/230.03
6,292,868 B1 * 9/2001 Norman ................... 365/202

FOREIGN PATENT DOCUMENTS

JP          11-328980      11/1999
WO          WO 99/01824    1/1999

* cited by examiner

Primary Examiner—David Nelms
Assistant Examiner—Thong Le
(74) Attorney, Agent, or Firm—Burns, Doane, Swecker & Mathis, LLP

(57) ABSTRACT

A nonvolatile semiconductor memory includes a memory block composed of a memory array having a plurality of memory cells arranged in a matrix form, each of the memory cells being composed of a nonvolatile transistor; a memory decoder necessary for erasing/writing/reading data of the nonvolatile transistor in the memory array; a charge pump necessary for erasing/writing/reading the data of the nonvolatile transistor in the memory array; a register having each of a plurality of control signals for controlling the memory decoder and the charge pump allocated to register 1 bit; and an updating device for updating a content of the register by a data processor coupled to the register. By using this updating device to update the content of the register, the memory decoder and the charge pump are controlled, the data of the memory block is erased, and data is written in/read from the nonvolatile transistor. Thus a selecting device other than a laser can be applied for suppressing the increase of an LSI circuit size in the same chip as that for a dedicated control circuit, verifying the disconnected state of a FUSE circuit in the memory, and trimming the FUSE circuit.

10 Claims, 19 Drawing Sheets

FIG.3

| | |
|---|---|
| E0H | ADDRESS REGISTER ADDRL |
| E1H | ADDRESS REGISTER ADDRM |
| E2H | ADDRESS REGISTER ADDRH |
| E4H | DATA REGISTER DATAL |
| E5H | DATA REGISTER DATAH |
| E6H | STATUS REGISTER |
| E7H | CONTROL SIGNAL REGISTER FOR PUMP/MEMORY DECODER (1) |
| E8H | CONTROL SIGNAL REGISTER FOR PUMP/MEMORY DECODER (2) |
| | |
| EEH | SIGNAL OUTPUT CONTROL REGISTER |
| | |
| F0H | SEQUENCE CONTROL REGISTER |
| | |
| F8H | DUMMY LT REGISTER 0 |

FIG.4

| b7 | b6 | b5 | b4 | b3 | b2 | b1 | b0 |
|---|---|---|---|---|---|---|---|
| BLSHT | ISE | DBRD | PGM | ERS | PE | NE | BYTE |

| b15 | b14 | b13 | b12 | b11 | b10 | b9 | b8 |
|---|---|---|---|---|---|---|---|
| | | | | | RE | LBCA | IPREP |

| b7 | b6 | b5 | b4 | b3 | b2 | b1 | b0 |
|----|----|----|----|----|----|----|----|
| X | X | ERASURE STATUS | WRITING STATUS | X | X | X | X |

| b7 | b6 | b5 | b4 | b3 | b2 | b1 | b0 |
|----|----|----|----|----|----|----|----|
| X | X | X | X | X | X | VERIFICATION STATUS | VERIFICATION STARTING BIT |

| b7 | b6 | b5 | b4 | b3 | b2 | b1 | b0 |
|----|----|----|----|----|----|----|----|
| WRITING FLAG | X | TRIMMING DATA | TRIMMING DATA | TRIMMING DATA | TRIMMING DATA | TRIMMING DATA | TRIMMING DATA |

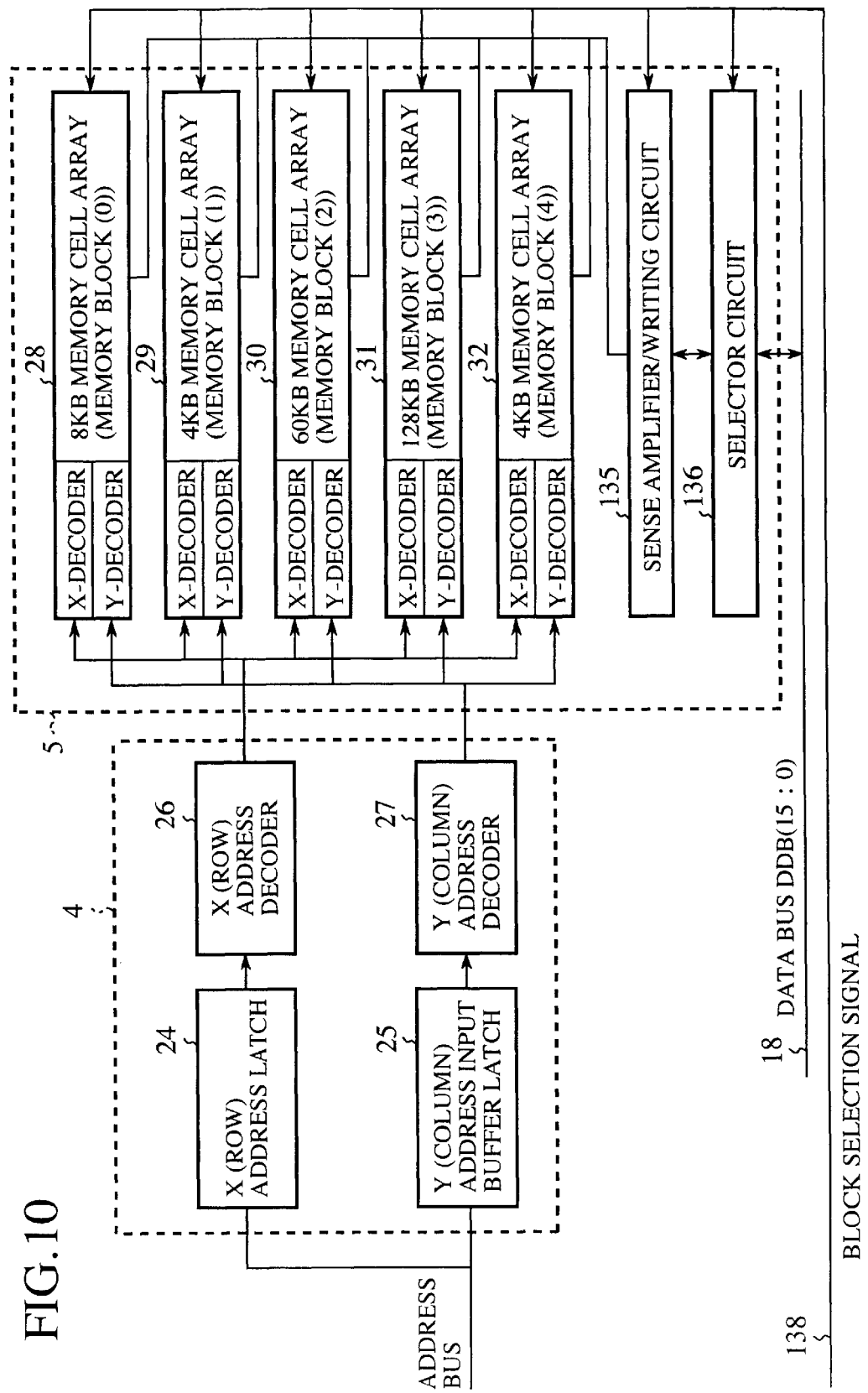

FIG.16A

FUSE CIRCUIT TRIMMING SPECIFICATION

| IREDEBL | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| Enable FUSE | H | L | L | L | L | L | L | L | L | L | L | L | L | L | L | L | L | L | L | L | L | L | L | L | L | L | L | L | L | L | L | H |
| I/O FUSE(4) | L | H | H | H | H | H | H | H | H | H | H | H | H | H | H | H | L | L | L | L | L | L | L | L | L | L | L | L | L | L | L | H |
| I/O FUSE(3) | L | L | L | L | L | L | L | L | H | H | H | H | H | H | H | H | L | L | L | L | L | L | L | L | H | H | H | H | H | H | H | H |
| I/O FUSE(2) | L | L | L | L | H | H | H | H | L | L | L | L | H | H | H | H | L | L | L | L | H | H | H | H | L | L | L | L | H | H | H | H |
| I/O FUSE(1) | L | L | H | H | L | L | H | H | L | L | H | H | L | L | H | H | L | L | H | H | L | L | H | H | L | L | H | H | L | L | H | H |
| I/O FUSE(0) | L | H | L | H | L | H | L | H | L | H | L | H | L | H | L | H | L | H | L | H | L | H | L | H | L | H | L | H | L | H | L | H |

FIG.16B

DUMMY LT REGISTER TRIMMING SPECIFICATION

| IREDEBL | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| DUMMY LT REGISTER b5 | H | H | H | H | H | H | H | H | H | H | H | H | H | H | H | H | H | H | H | H | H | H | H | H | H | H | H | H | H | H | H | H |
| DUMMY LT REGISTER b0 | L | H | H | H | H | H | H | H | H | H | H | H | H | H | H | H | L | L | L | L | L | L | L | L | L | L | L | L | L | L | L | H |
| DUMMY LT REGISTER b1 | L | L | L | L | L | L | L | L | H | H | H | H | H | H | H | H | L | L | L | L | L | L | L | L | H | H | H | H | H | H | H | H |
| DUMMY LT REGISTER b2 | L | L | L | L | H | H | H | H | L | L | L | L | H | H | H | H | L | L | L | L | H | H | H | H | L | L | L | L | H | H | H | H |
| DUMMY LT REGISTER b3 | L | L | H | H | L | L | H | H | L | L | H | H | L | L | H | H | L | L | H | H | L | L | H | H | L | L | H | H | L | L | H | H |
| DUMMY LT REGISTER b4 | L | H | L | H | L | H | L | H | L | H | L | H | L | H | L | H | L | H | L | H | L | H | L | H | L | H | L | H | L | H | L | H |

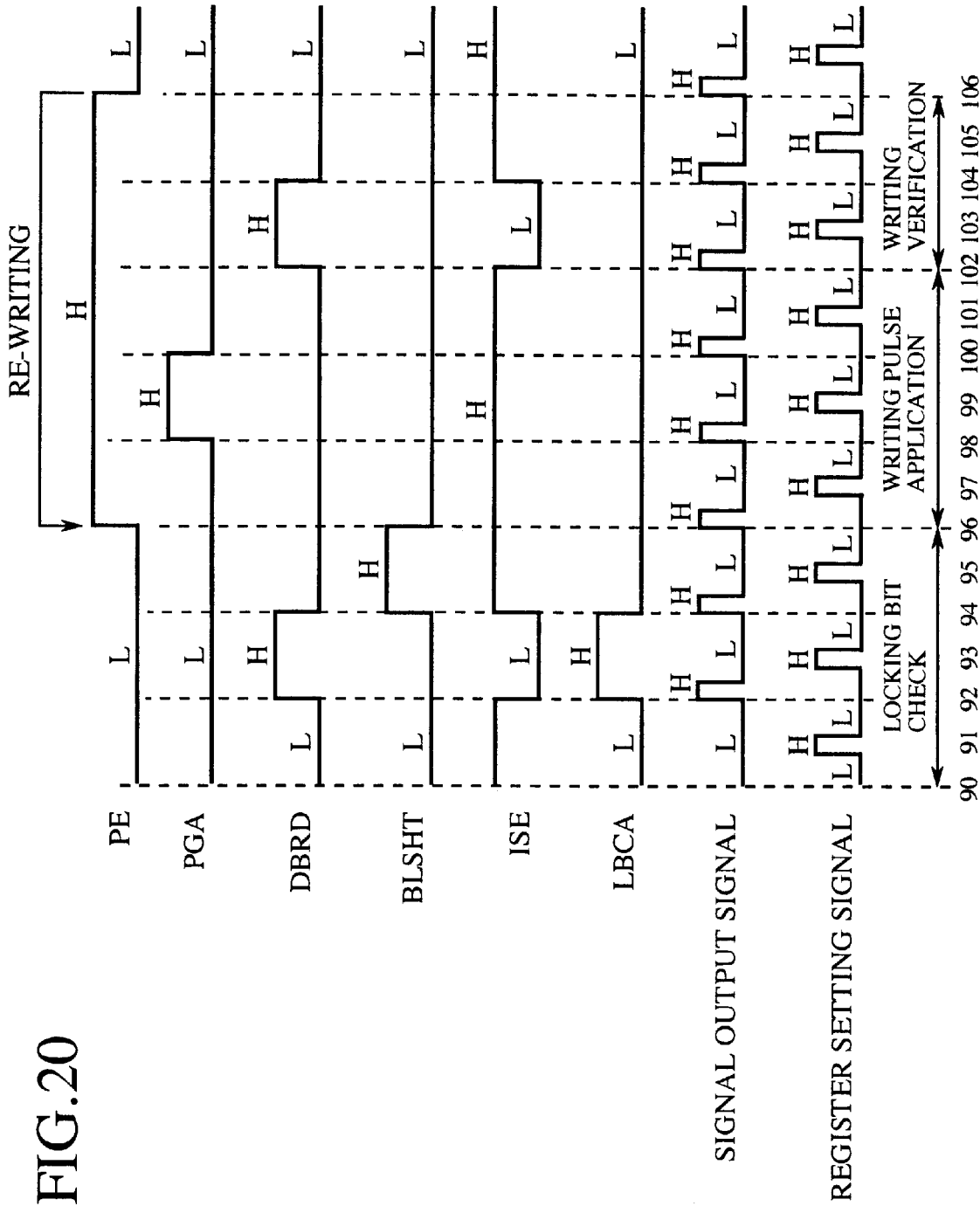

NONVOLATILE SEMICONDUCTOR MEMORY AND AUTOMATIC ERASING/WRITING METHOD THEREOF

BACKGROUND OF THE INVENTION

1. Field of the Invention

The present invention relates to a nonvolatile semiconductor memory using a nonvolatile transistor, and an automatic erasing/writing method thereof.

2. Description of the Prior Art

FIG. 26 is a block diagram showing the entire configuration of a conventional nonvolatile semiconductor memory. In the drawing, a reference numeral 1001 designates a nonvolatile semiconductor memory; 1002 designates a memory/memory decoder; 1003 designates a charge pump; and 1004 designates a dedicated control circuit including an MCU or the like.

The memory/memory decoder 1002 is composed of a memory block and a memory decoder. The memory block includes a plurality of small memory blocks having various integration degrees, a sense amplifier/writing circuit, a selector circuit, and so on. The memory decoder includes a row address latch, a column address input buffer latch, a row/column address pre-decoder, and so on (not shown). In addition, the charge pump 1003 includes a negative/positive voltage charge pump, and a reading pump (not shown). For details and operations, refer to the later description of the preferred embodiment.

Thus, the conventional nonvolatile semiconductor memory 1001 can execute memory controls such as automatic erasing/automatic writing/data reading and the like, by using the dedicated control circuit 1004 provided in the nonvolatile semiconductor memory 1001. The dedicated control circuit 1004 provided in the nonvolatile semiconductor memory 1001 is a circuit specialized for executing only the memory control and, for an LSI or the like having a data processor and a nonvolatile semiconductor memory in the same chip, the scale of this dedicated control circuit 1004 has been enlarged to a level, which cannot be ignored.

International Publication WO99/01824 describes a method for controlling each control signal needed to control an EEPROM not by a dedicated control circuit but by a register block composed of a flip-flop in a semiconductor device with the built-in EEPROM. In recent years, however, in the case of a nonvolatile semiconductor memory incorporated in a microcontroller, there have been many kinds of signals to be controlled because of the presence of a charge pump for generating a voltage necessary for erasure/write inside the chip, and so on, and there have been a plurality of operation modes other than the erasure/write. Thus, by the register block composed of the flip-flop described in WO99/01824, it is impossible to perform an control by setting a plurality of control signals simultaneously active, or setting active control signals having a different combination every operation mode by the same timing.

In addition, for the conventional nonvolatile semiconductor memory, a memory array in the memory block composed of the memory array having a plurality of memory cells arranged in a matrix form can be replaced by a dummy memory array. This replacing processing can be carried out by separating or disconnecting a FUSE circuit provided in the nonvolatile semiconductor memory by laser.

Since the conventional nonvolatile semiconductor memory and the automatic erasing/writing method thereof have been constructed in the foregoing manner, there has been an inherent problem, i.e., the presence of the dedicated control circuit in the memory has brought about the increase of the circuit size of the LSI having the data processor and the nonvolatile semiconductor memory in the same chip.

Another inherent problem has been the impossibility of a direct verification whether the successful disconnection of the FUSE circuit is performed or not in the conventional nonvolatile semiconductor memory after it has been disconnected by laser.

Furthermore, in the conventional nonvolatile semiconductor memory, in order to replace the memory array in the memory block, composed of the memory array having the plurality of memory cells arranged in a matrix form, with the dummy memory cell array, there is no way other than a trimming processing for the FUSE circuit by laser. Alternatively, there are no methods of performing that replacement by using a pseudo replacement processing.

SUMMARY OF THE INVENTION

The present invention was made to solve the foregoing problems. Objects of the invention are to provide a nonvolatile semiconductor memory capable of eliminating a dedicated control circuit provided in the nonvolatile semiconductor memory by executing the automatic erasing/writing/data reading, and so on, of the nonvolatile semiconductor memory using a data processor provided in the same chip as that for the nonvolatile semiconductor memory, and thereby reducing the circuit size of the entire chip, and an automatic erasing/writing method thereof.

The other object is to provide a nonvolatile semiconductor memory capable of replacing a memory array in a memory block composed of the memory array having a plurality of memory cells arranged in a matrix form by a dummy memory, by providing a dummy register in the nonvolatile semiconductor memory, and setting a register value.

In accordance with a first aspect of the invention, there is provided a nonvolatile semiconductor memory, comprising: a memory bock composed of a memory array having a plurality of memory cells arranged in a matrix form, each of the memory cells being composed of a nonvolatile transistor; a memory decoder necessary for erasing/writing/reading data of the nonvolatile transistor in the memory array; a charge pump necessary for erasing/writing/reading the data of the nonvolatile transistor in the memory array; a register having each of a plurality of control signals for controlling the memory decoder and the charge pump allocated to register 1 bit; means for updating a content of the register by a data processor coupled to the register; and means for controlling the memory decoder and the charge pump by updating the content of the register.

In this case, the nonvolatile semiconductor memory may further comprise means for erasing data of the memory block by updating the content of the register.

The nonvolatile semiconductor memory may further comprise means for writing data in the nonvolatile transistor in the memory block by updating the content of the register.

Moreover, the nonvolatile semiconductor memory may further comprise means for reading data from the nonvolatile transistor in the memory block by updating the content of the register.

In accordance with a second aspect of the invention, there is provided an automatic erasing method of a nonvolatile semiconductor memory. The nonvolatile semiconductor memory includes: a memory block composed of a memory array having a plurality of memory cells arranged in a matrix form, each of the memory cells being composed of a nonvolatile transistor; a memory decoder necessary for erasing/writing/reading data of the nonvolatile transistor in the memory array; a charge pump necessary for erasing/writing/reading the data of the nonvolatile transistor in the memory array; a register having each of a plurality of control signals for controlling the memory decoder and the charge pump allocated to register 1 bit; and means for updating a content of the register by a data processor coupled to the register. The automatic erasing method comprises the step of: erasing data of the memory block by using the updating means to update the content of the register.

In accordance with a third aspect of the invention, there is provided an automatic writing method of a nonvolatile semiconductor memory. The nonvolatile semiconductor memory includes: a memory block composed of a memory array having a plurality of memory cells arranged in a matrix form, each of the memory cells being composed of a nonvolatile transistor; a memory decoder necessary for erasing/writing/reading data of the nonvolatile transistor in the memory array; a charge pump necessary for erasing/writing/reading the data of the nonvolatile transistor in the memory array; a register having each of a plurality of control signals for controlling the memory decoder and the charge pump allocated to register 1 bit; and means for updating a content of the register by a data processor coupled to the register. The automatic writing method comprises the step of: writing data in the nonvolatile transistor in the memory block by using the updating means to update the content of the register.

In accordance with a fourth aspect of the invention, there is provided a nonvolatile semiconductor memory, comprising: a memory block composed of a memory array having a plurality of memory cells arranged in a matrix form, each of the memory cells being composed of a nonvolatile transistor; a dummy memory array for replacing the memory array; first means for replacing one memory array in the memory block by the dummy memory array, by executing trimming processing; second means for replacing one memory array in the memory block by the dummy memory array, by setting data in a dummy register, without using a replacing circuit including the dummy memory array; and means for replacing the memory array by the dummy memory array carried out by the first means, by the second means.

In this case, the nonvolatile semiconductor memory may further comprise means for giving priority to the replacement by the first means even if replacement processing by the second means has been set, when one memory array in the memory block is replaced by the dummy memory array by the first means.

The nonvolatile semiconductor memory may further comprise means for reading information regarding the replacement of one memory array in the memory block by the dummy memory array by the first means, and information regarding the replacement processing by the second means, and comparing these bits of information with each other.

Moreover, the nonvolatile semiconductor memory may further comprise: means for writing a dummy register value set by the replacement processing of the second means in the memory cell composed of the nonvolatile transistor, and then reading the dummy register value; and means for reading bits of information regarding the replacement processing by the first and second means, and comparing these bits of information with each other.

BRIEF DESCRIPTION OF THE DRAWINGS

FIG. 3 is a view showing an address space allocated to each register of the register circuit group of the nonvolatile semiconductor memory of the embodiment 1 of the invention;

FIG. 4 is a view showing contents of control signal registers (1) and (2) for a pump/memory decoder;

FIG. 10 is a view showing a configuration of a memory decoder;

FIGS. 16A and 16B are views respectively showing FUSE circuit trimming specification and dummy LT register trimming specification;

FIG. 20 is a timing chart of automatic writing;

DETAILED DESCRIPTION OF THE PREFERRED EMBODIMENTS

Next, an embodiment of the present invention will be described.

Embodiment 1

(Block Configuration)

Figure 1:
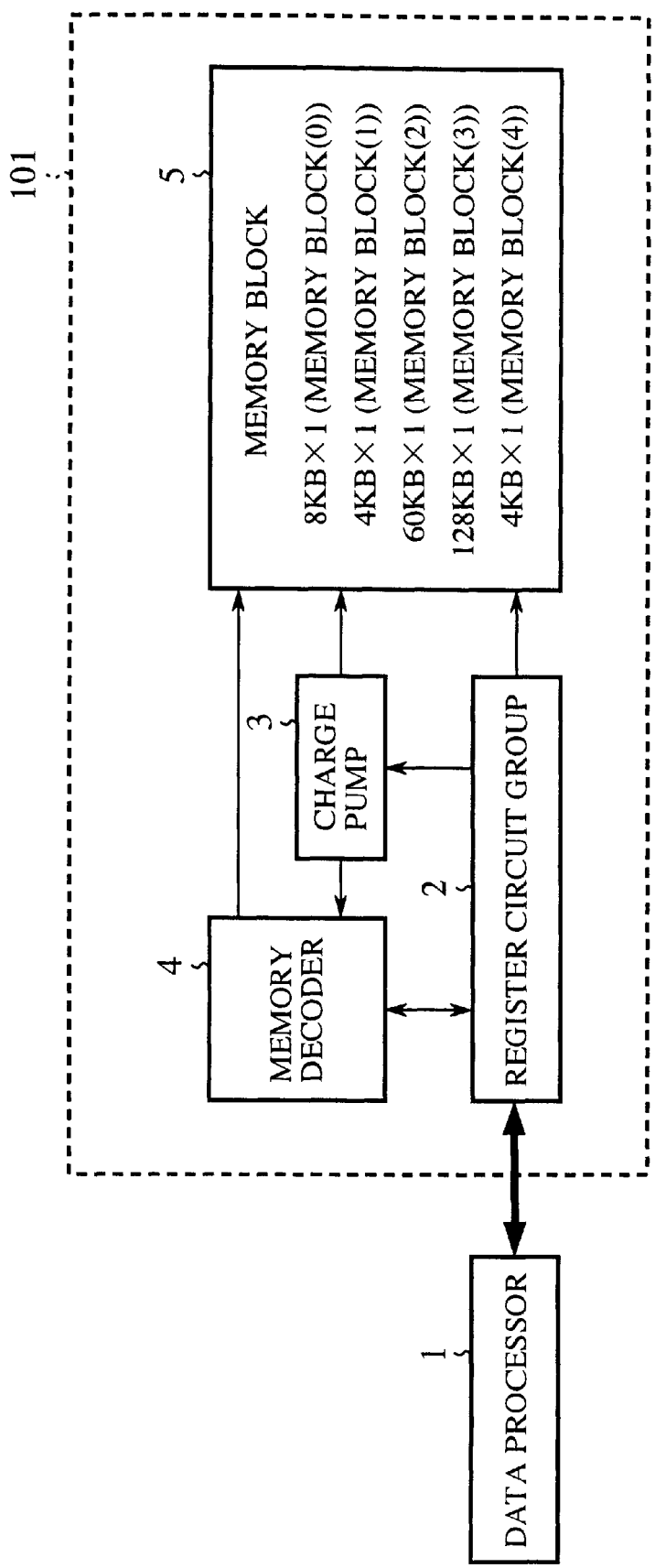
FIG. 1 is a block diagram showing a function block and a data processor of a nonvolatile semiconductor memory according to an embodiment 1 of the present invention.

FIG. 1 is a block diagram showing the entire configuration of a nonvolatile memory device according to an embodiment 1 of the invention, specifically showing a relation with a data processor for controlling the nonvolatile semiconductor memory. In the drawing, a reference numeral 101 designates a nonvolatile semiconductor memory; 1 designates a data processor; 2 designates a register circuit group (register): 3 designates a charge pump; 4 designates a memory decoder; and 5 designates a memory block.

The nonvolatile semiconductor memory 101 of the embodiment 1 of the invention includes: an automatic erasure mode for erasing the content of the memory; an automatic writing mode for writing data in an arbitrary address; a locking bit writing mode for writing locking information in a locking bit; a locking bit reading mode for reading the content of the locking bit; and a reading mode for reading the content of memory data.

(Register Circuit Group)

Figure 2:
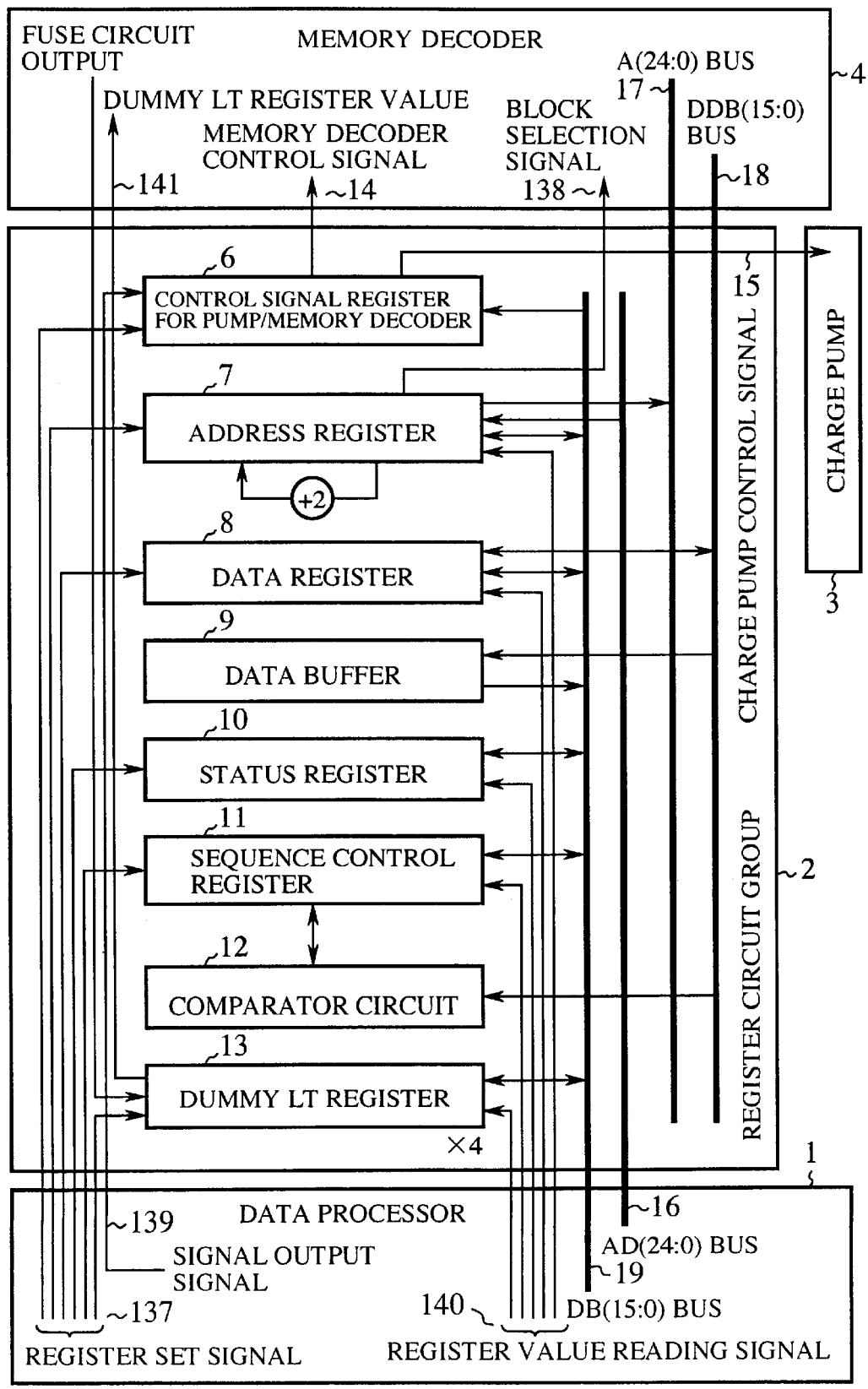
FIG. 2 is a block diagram showing a register circuit group of the nonvolatile semiconductor memory of the embodiment 1 of the invention.

FIG. 2 is a block diagram showing the register circuit group of the nonvolatile semiconductor memory according to the embodiment 1 of the invention. In the drawing, a reference numeral 6 designates a control signal register for a pump/memory decoder; 7 designates an address register; 8 designates a data register; 9 designates a data buffer; 10 designates a status register; 11 designates a sequence control register; 12 designates a comparator circuit; 13 designates a dummy LT register; 14 designates a memory decoder control signal; 15 designates a charge pump control signal; 16 designates an AD(24:0) bus (updating means); 17 designates A(24:0) bus (updating means); 18 designates a DDB(15:0) bus (updating means); 19 designates a DB(15:0) bus (updating means); 137 designates a register set signal; 138 designates a block selection signal; and 139 designates a signal output signal.

The control signal register 6 for the pump/memory decoder is a 16-bit register having each of control signals for controlling the pump and the memory decoder allocated to register 1 bit. There are paths including: an input path from the DB(15:0) bus 19; a path for outputting the charge pump control signal 15 among the control signals allocated in the register to the charge pump 3; and a path for outputting the memory decoder control signal 14 among the control signals allocated in the register to the memory decoder 4. The setting of data in the control signal register 6 for the pump/memory decoder is carried out from the DB(15:0) bus 19 by using the register setting signal 137 entered from the data processor 1 as a trigger. In addition, the memory decoder control signal 14 and the charge pump control signal 15 are outputted to the memory decoder 4 and the charge pump 3 by using the signal output signal 139 entered from the data processor 1 as a trigger.

The address register 7 holds the address of a block to be accessed when automatic erasure, automatic writing, locking bit writing, or locking bit reading is carried out. In addition, the address register 7 has an address increment function, and increments an address to the maximum address of the memory block targeted for erasure at the time of erasure verification of automatic erasure. The address register 7 includes an input path from the AD(24:0) bus 16, and an output path to the A(24:0) bus 17. The setting of data in the address register 7 is carried out from the DB(15:0) bus 19 by using the register setting signal 137 entered from the data processor 1. The reading of an address value from the address register 7 can be made to the DB(15:0) bus 19 based on a register value reading signal 140. Further, the block selection signal 138 is generated from the address value, and outputted to the memory decoder 4.

The data register 8 holds writing data at the time of automatic writing, and a locking bit value read at the time of locking bit reading. There are an I/O path from the DB(15:0) bus 19, and an I/O path from the DDB bus 18. The setting of data in the data register 8 is carried out from the DB(15:0) bus 19 by using the register setting signal 137 entered from the data processor 1 as a trigger. In addition, the reading of an address value from the data register 8 can be made to the DB(15:0) bus 19 based on the register value reading signal 140.

The data buffer 9 directly outputs the value of the DDB (15:0) to the DB bus 19 at the time of memory data reading. There are an input path from the DDB(15:0) bus 18, and an output path to the DB(15:0) bus 19.

The status register 10 holds an erasing error or writing error information at the time of automatic erasing, automatic writing or locking bit writing. There is an input path from the DB(15:0) bus 19. The setting of data in the status register 10 is carried out from the DB(15:0) bus 19 by using the register setting signal 137 entered from the data processor 1 as a trigger. The reading of a register value from the status register 10 can be made to the DB(15:0) bus 19 based on the register value reading signal 140.

The sequence control register 11 is a 2 bit register, which has an erasure verification starting bit and an error setting bit. The input path from the DB(15:0) bus 19, and the information of the register 2 bit are outputted to the comparator circuit 12. When an erasing error occurs during automatic erasure, the comparator circuit 12 operates the error setting bit of the sequence control register 11. The setting of data in the sequence control register 11 is carried out from the DB(15:0) bus 19 by using the register setting signal 137 entered from the data processor 1 as a trigger. The reading of a register value from the sequence control register 11 can be made to the DB(15:0) bus 19 based on the register value reading signal 140.

The comparator circuit 12 compares the memory data read at the time of erasure verification during automatic erasure with an expected value. Based on the result of the comparison, the erasure verification starting bit and the error setting bit of the sequence control register 11 are rewritten.

The dummy LT register 13 is a register designed to set data when a bit line is rewritten into a dummy one. The number of registers provided is equal to the number of memory blocks. The setting of data in the dummy LT register 13 is carried out from the DB(15:0) bus 19 by using the register setting signal 137 entered from the data processor 1 as a trigger. The reading of a register value from the dummy LT register 13 can be made to the DB(15:0) bus 19 based on the register value reading signal 140. Further, the value of the dummy LT register 13 has been outputted directly to the memory decoder 4. Also, the output signal of a FUSE circuit 52 (see FIG. 15) in the memory decoder 4 has been outputted to the dummy LT register 13. There is a path for outputting the output signal value of the FUSE circuit 52 through the dummy LT register 13 to the-DB(15:0) bus 19.

FIG. 3 shows an address space allocated to each of various registers in the register circuit group 2 of the nonvolatile semiconductor memory of the embodiment 1 of the invention. This address space is described below.

The address register 7 includes an 8-bit address register (ADDRL), an 8-bit address register (ADDRM), and an 8-bit address resister (ADDRH). These address registers (ADDRL), (ADDRM) and (ADDRH) are respectively allocated to E0H, E1H, and E2H.

The data register 8 includes a lower 8-bit data register (DATAL), and an upper 8-bit data register (DATAH). The data registers (DATAL) and (DATAH) are respectively allocated to E4H and E5H.

The status register 10 is an 8-bit register allocated to E6H.

The control signal registers 1 and 2 for the pump/memory decoder are respectively allocated to E7H and E8H.

The output signal register is allocated to EEH. The signal output signal 139 is made active by setting 1 in the output signal register, and the contents of the control signal registers 1 and 2 for the pump/memory decoder are outputted to the charge pump 3 and the memory decoder 4.

The sequence control register 11 is an 8-bit register allocated to-F0H. The dummy LT register 0 is an 8-bit register allocated to F8H.

(Register Specification)

(Control Signal Register 6 for Pump/Memory Decoder)

FIG. 4 shows the content of the control signal register 6 for the pump/memory decoder. Among 16 bits of b0 to b15 of the register, the b0 to b7 are for the control signal register 6(1) for the pump/memory decoder. The bits of b8 to b15 are for the control signal register 6(2) for the pump/memory decoder.

The bit b0 of the control signal register 6(1) for the pump/memory decoder is allocated to a BYTE signal. To access the nonvolatile semiconductor memory of the embodiment 1 of the invention on a byte mode, "1" is set in the BYTE signal. During word accessing, "0" is set. The BYTE signal is outputted to the memory decoder 4.

The bit b1 of the control signal register 6(1) for the pump/memory decoder is allocated to a NE signal. For the PE signal, "1" is set when the negative voltage pump loaded in the nonvolatile semiconductor memory of the embodiment 1 of the invention is activated. The PE signal is outputted to the charge pump 3.

The bit b2 of the control signal register 6(1) for the pump/memory decoder is allocated to a PE signal. For the PE signal, "1" is set when the positive voltage pump loaded in the nonvolatile semiconductor memory of the embodiment 1 of the invention is activated. The PE signal is outputted to the charge pump 3.

The bit b3 of the control register 6(1) for the pump/memory decoder is allocated to an ERS signal. For the ERS signal, "1" is set as an erasure pulse during erasure. The ERS signal is outputted to the memory decoder 4.

The bit b4 of the control signal register 6(1) for the pump/memory decoder is allocated to a PGM signal. For the PGM signal, "1" is set as a writing pulse during writing. The PGM signal is outputted to the memory decoder 4.

The bit b5 of the control signal register 6(1) for the pump/memory decoder is allocated to a DBRD signal. For the DBRD signal, "1" is set when memory data is read out. The DBRD signal is outputted to the memory decoder 4.

The bit b6 of the control signal register 6(1) for the pump/memory decoder is allocated to an ISE signal. For the ISE signal, "0" is set when memory data is read. The ISE signal is outputted to the memory decoder 4.

The bit b7 of the control signal 6(1) for the pump/memory decoder 4 is allocated to a BLSHT signal. For the BLSHT signal, "1" is set when the bit line of the memory is discharged. The BLSHT signal is outputted to the memory decoder 4.

The bit b8 of the control signal register 6(2) for the pump/memory decoder is allocated to an IPREP signal. For the IPREP signal, "0" is set as a before-erasure writing pulse during automatic erasure at the time of writing before erasure. The IPREP signal is outputted to the memory decoder 4.

The bit b9 of the control signal register 6(2) for the pump/memory decoder is allocated to an LBCA signal. For the LBCA signal, "1" is set at the time of locking bit accessing. The LBCA signal is outputted to the memory decoder 4.

The bit b10 of the control signal register 6(2) for the pump/memory decoder is allocated to an RE signal. Based on the RE signal, the reading charge pump is activated. For bit b10 of the control signal register 6(2) for the pump/memory decoder, "1" is set as a default value.

(Status Register 10)

Figures 5, 6, 7, 8:
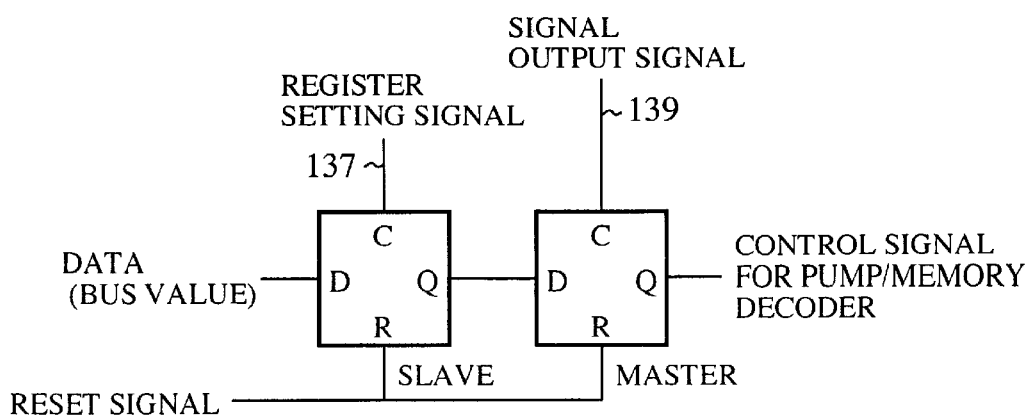
FIG. 5 is a view showing a content of a status register.
FIG. 6 is a view showing a content of a sequence control register.
FIG. 7 is a view showing a content of a dummy LT register.
FIG. 8 is a view showing a circuitry of 1 bit among control signal registers for the pump/memory decoder.

FIG. 5 shows the content of the status register 10. Status flags are allocated to the bits b4 and b5 among the 8 bits of the register. The other bits are reserve bits.

The bit b4 of the status register 10 is a writing status bit. "1" is set when an error occurs during the execution of automatic writing.

The bit b5 of the status register 10 is an erasure status bit. "1" is set when an error occurs during the execution of automatic erasure.

(Sequence Control Register 11)

FIG. 6 shows the content of the sequence control register 11. Sequence flags are allocated to the bits b0 and b1 among the 8 bits of the register. The other bits are reserve bits. The bit b0 of the sequence control register 11 is a verification starting bit. "1" is set at the time of a verification execution during automatic erasure.

The bit b1 of the sequence control register 11 is a verification status bit. "1" is set when an error occurs in the result of the verification during the automatic erasure.

(Dummy LT Register 13)

FIG. 7 shows the content of the dummy LT register 13. Dummy trimming data for bit line replacement are allocated to the bits b0 to b5 among the 8 bits of the register. In addition, dummy LT register writing information is allocated to the bit b7. The other bits are reserve bits.

For the register value of the bits b0 to b5, "1" is set in the bit of the register corresponding to the bit line to be replaced, and thereby dummy bit line replacement can be carried out. For the bit b7, "1" is set when trimming data is set.

(Hardware Configuration)

(Circuitry of Control Signal Register 6 for Pump/Memory Decoder)

FIG. 8 shows the circuitry of 1 bit of the control signal register 6 for the pump/memory decoder. The circuit of 1 bit of the control signal register 6 for the pump/memory decoder is composed of a 2-bit register of a slave/master configuration.

For the setting of a value in the register, a register setting value from data (bus value) is entered, and the value is held by using the register setting signal 137 as a trigger. The held data is outputted to the pump/memory decoder as a control signal therefor by using the signal output signal 139 as a trigger. The signal output signal becomes active when the signal output control register shown in FIG. 3 is accessed. The register value is initialized based on a resetting signal.

(Charge Pump)

Figure 9:
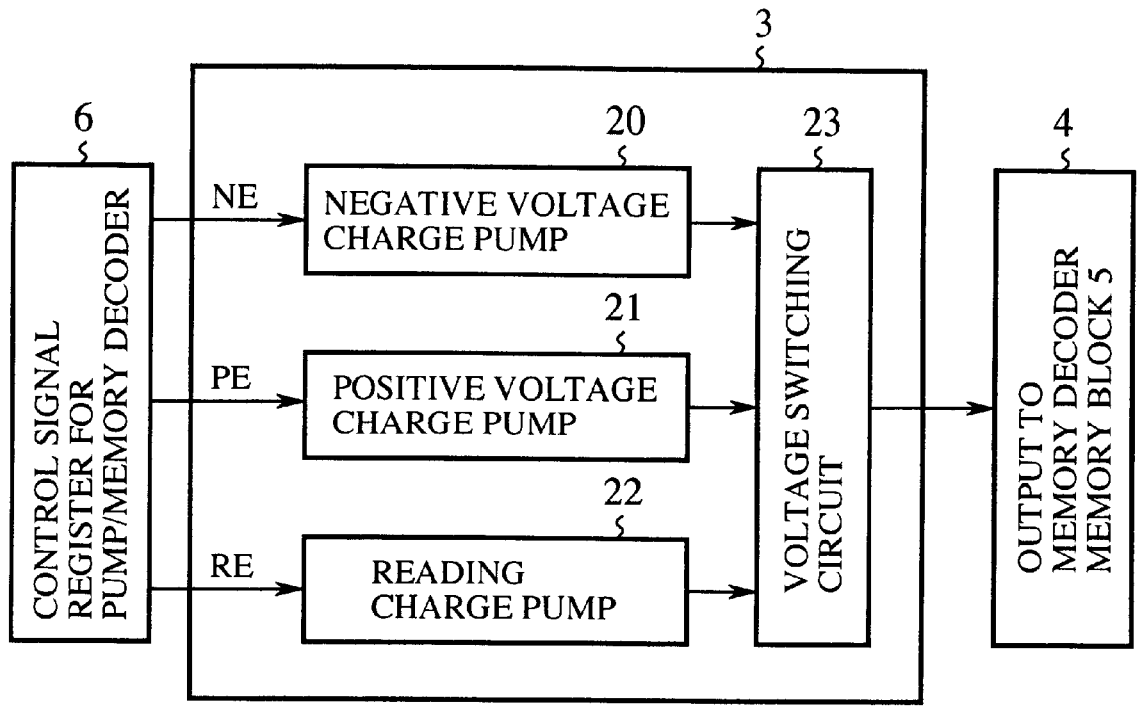
FIG. 9 is a view showing a block configuration of a charge pump.

FIG. 9 is a block diagram showing the charge pump 3. In the drawing, reference numerals 20 and 21 designate negative and positive voltage charge pumps respectively; 22 designates a reading charge pump; and 23 a voltage switching circuit. The charge pump 3 is composed of the negative and positive voltage charge pumps 20 and 21, and the reading charge pump 22.

The charge pump 3 is controlled based on a signal from the control signal register 6 for the pump/memory decoder, and the output of each charge pump is supplied to the memory decoder 4 and the memory block 5 by the voltage switching circuit 23.

The negative voltage charge pump is a charge pump for generating a negative voltage for erasure, specifically generating a negative voltage during automatic erasure.

The positive voltage charge pump is a charge pump for generating a positive voltage for writing/erasure, specifically generating a positive writing voltage during writing, and a positive erasure voltage during erasure.

The reading charge pump is a charge pump for generating a positive voltage for reading/verification, specifically generating a reading voltage during reading, and a verification voltage during writing/writing verification.

FIG. 10 shows the configuration of the memory block 5 and the memory decoder 4.

In the drawing, a reference numeral 24 designates an X (row) address latch; 25 designates a Y (column) address input buffer latch; 26 designates an X (row) address pre-decoder; 27 designates a Y (column) address pre-decoder; 28 to 32 designate memory blocks (0) to (4) respectively; 135 designates a sense amplifier/writing circuit; 136 designates a selector circuit; and 138 designates a block selection signal. The other reference numerals similar to those described above denote similar components or parts, and these redundant descriptions will be omitted, hereinafter.

(Memory Decoder)

First, the memory decoder 4 includes: a Y (column) address input buffer-latch 25; an X (row) address latch 24; a Y (column) address pre-decoder 27; and an X (row) address pre-decoder 26. Each of the Y (column) address input buffer latch 25 and the X (row) address latch 24 latches an address sent through the address bus from the address register 7. The latched address is subjected to address pre-decoder processing at each of the Y (column) address pre-decoder 27 and the X (row) address pre-decoder 26, and the pre-decoded address is outputted to the memory block 5.

(Memory Block)

The memory block 5 includes: an 8 KB memory block (0) 28; a 4 KB memory block (1) 29; a 60 KB memory block (2) 30; a 128 KB memory block (3) 31; a 4 KB memory block (4) 32; a sense amplifier/writing circuit 135; and a selector circuit 136. Each memory block is composed of an X decoder, a Y decoder, and a memory array. The sense amplifier/writing circuit 135 has a path for receiving an output from each memory block and outputting the data to the data bus, and a path for writing the value of the data bus in the memory by the sense amplifier/writing circuit 135 and the selector circuit 136.

Figure 11:
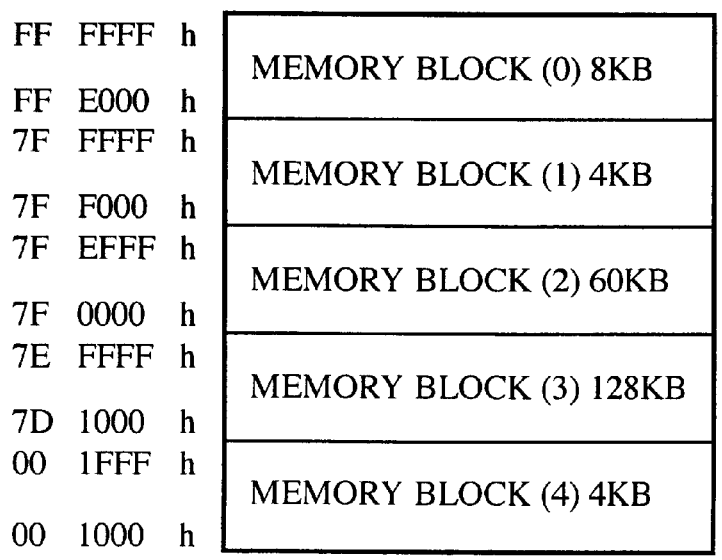
FIG. 11 is a view showing an address space of a memory block.

FIG. 11 shows the address space of the memory block 5.

A memory block (4) has the address space of "001000" to "001FFFh" in hexadecimal number notation.

A memory block (3) has the address space of "7D1000h" to "7EFFFFh" in hexadecimal number notation.

A memory block (2) has the address space of "7F0000h" to "7FEFFFh" in hexadecimal number notation.

A memory block (1) has the address space of "7FF0000h" to "7FFFFh" in hexadecimal number notation.

A memory block (0) has the address space of "FFE000h" to "FFFFFh" in hexadecimal notation.

Figure 12:
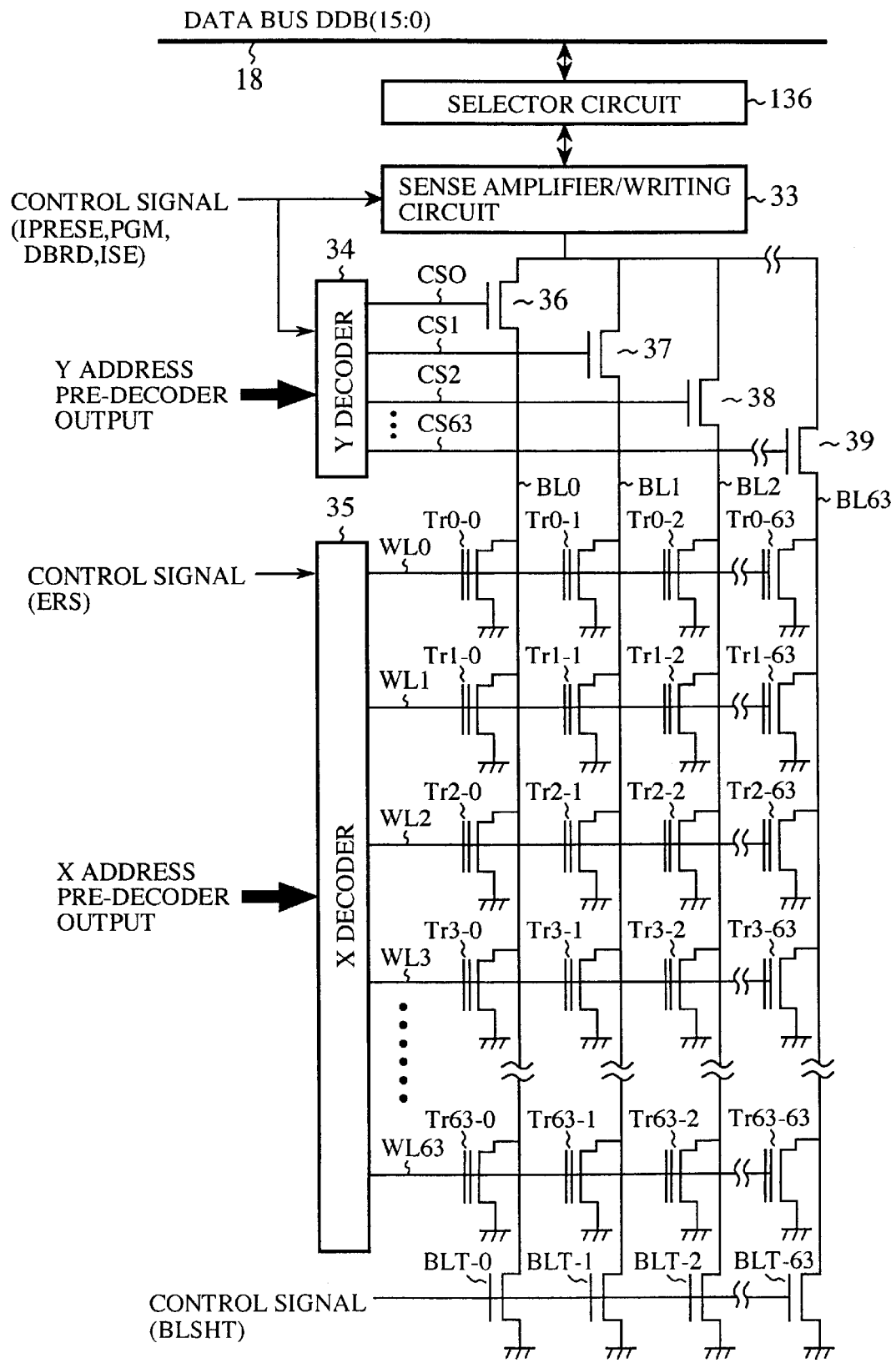
FIG. 12 is a view showing a configuration of a 128 KB memory block.

FIG. 12 shows the X and Y decoders, the memory array, and the sense amplifier/writing circuit extracted from the 128 KB memory block (3) of the blocks shown in FIG. 10. In the drawing, a reference numeral 33 designates a sense amplifier/writing circuit; 34 designates a Y decoder; 35 designates an X decoder, and 36 to 39 each designate transistors. For the memory array, only a part coupled to one sense amplifier/writing circuit 33 is shown.

The Y decoder 34 receives an output from the Y address decoder 27, and generates 64 control signals (CS0 to CS63) for selecting one from 64 bit lines (BL0 to BL63). The control signals (CS0 to CS63) are coupled to the gates of the transistors 36 to 39 for selecting the bit lines.

The X decoder 35 receives an output from the X address decoder 26, and selects and controls one from 64 word lines (WL0 to WL63).

Memory cells (Tr0-0 to Tr0-63, Tr1-0 to Tr1-63, Tr2-0 to Tr2-63, Tr3-0 to Tr3-63, . . . , Tr63-0 to Tr63-03) composed of nonvolatile transistors having floating gates are arranged in a matrix form.

Among the above, in the memory cells (Tr0-0 to Tr63-0, Tr0-1 toTr63-1, Tr0-2 to Tr63-2, . . . , Tr0-63 to Tr63-63) arranged in the same row, the same bit lines (BL0 to BL63) are connected to source terminals, and the different word lines (WL0 to WL63) are connected to gate terminals.

For the reading of memory data, in accordance with the outputs of the X and Y address pre-decoders 26 and 27, bit and word lines, one each, are selected from the bit lines (BL0 to BL63) and the work lines (WL0 to WL63), and the content of the memory cells composed of the nonvolatile transistor having the floating gate connected to the selected bit and word lines is outputted through the sense amplifier of the sense amplifier/writing circuit 33 to the data bus.

For the writing of memory data, in accordance with the outputs of the X and Y address pre-decoders 26 and 27, bit and word lines, one each, are selected from the bit lines (BL0 to BL63) and the word lines (WL0 to WL63), and the value of the data bus is written-through the writing circuit of the sense amplifier/writing circuit 33 in the memory cell composed of the nonvolatile transistor having the floating gate connected to the selected bit and word lines.

Further, for the erasure of memory data, when an erasure pulse (ERS) is applied to the memory block targeted for data erasure, a positive erasure voltage is applied to the gate of the memory cell composed of the nonvolatile transistor having the floating gate, and the content of the memory is erased.

(Dummy Memory Array)

Figure 13:
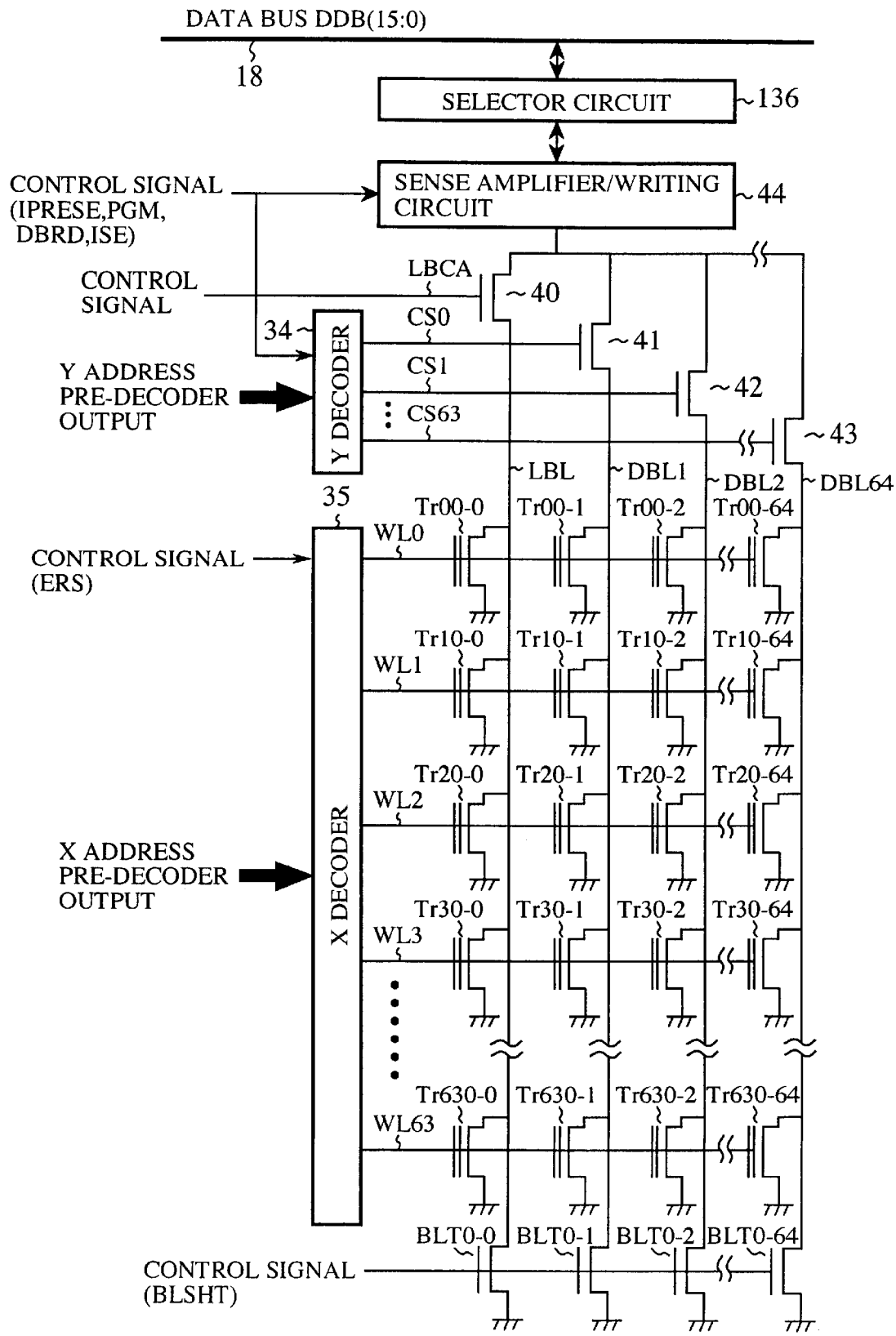
FIG. 13 is a view showing a configuration of the 128 KB memory block including a dummy array.

FIG. 13 shows the X and Y decoders, the dummy memory array, the sense amplifier/writing circuit and the selector circuit extracted from the 128 KB memory block (3) of the blocks shown in FIG. 10. In the drawing, reference numerals 40 to 43 each designate a transistor; and 44 designates a sense amplifier/writing circuit. For the memory array, only a part coupled to one sense amplifier/writing circuit 44 is shown.

The decoder 34 receives an output from the Y address pre-decoder 27, and generates 64 control signals (CS0 to CS63) for selecting one from 64 bit lines (DBL1 to DBL64). The control signals (CS0 to CS63) are coupled to the gates of the transistors 41 to 43 for selecting the bit lines.

The X decoder 35 receives an output from the X address pre-decoder 26, and selects and controls one from 64 word lines (WL0 to WL63).

The locking bit line (LBL) is a bit line, to which the nonvolatile transistor (Tr00-0) indicating a locked/unlocked state for each memory block is connected.

In addition, dummy memory cells composed of nonvolatile transistors having floating gates, and locking bit memory cells (Tr00-0 to Tr00-64, Tr10-0 to Tr1-64, Tr20-0 to Tr20-64, Tr20-0 to Tr30-64, . . . , Tr630-0 to Tr630-64) are arranged in a matrix form.

Among the above, in the memory cells (Tr00-0 to Tr630-0, Tr00-1 to Tr630-1, Tr00-2 to Tr630-2, . . . , Tr00-64 to Tr630-64) arranged in the same row, the same bit lines (DBL1 to DBL64) are connected to source terminals, and different word lines (WL0 to WL63) are connected to gate terminals. The DBL1 to DBL64 are dummy bit lines, and LBL is a locking bit line.

For the reading of dummy memory cell data, in accordance with the outputs of the X and Y address pre-decoders 26 and 27, bit and word lines, one each, are selected from the bit lines (DBL1 to DBL64) and the word lines (WL0 to WL63), and the content of the memory cell composed of the nonvolatile transistor having the floating gate connected to the selected bit and word lines is outputted through the sense amplifier of the sense amplifier/writing circuit 44 to the data bus.

For the writing of dummy memory cell data, in accordance with the outputs of the X and Y address pre-decoders 26 and 27, bit and word lines, one each, are selected from the dummy bit lines (DBL1 to DBL64) and the word lines (WL0 to WL63), and the value of the data bus is written through the writing circuit of the sense amplifier/writing circuit 44 in the memory cell composed of the nonvolatile transistor having the floating gate connected to the selected bit and word lines, For the reading of the locking bit memory cell data, a control signal (LBCA) is selected, the word line (WL0) is selected by the X decoder 35, and the value of the nonvolatile memory transistor (Tr00-0) as locking bit memory data is outputted through the sense amplifier of the sense amplifier/writing circuit 44 to the data bus. For the writing of data in the locking bit memory, a control signal (LBCA) is selected, the word line (WL0) is selected by the X decoder 35, and the value of data zero is written through the writing circuit of the sense amplifier/writing circuit 44 in the nonvolatile memory transistor (Tr00-0) as locking bit memory data.

Further, for the erasure of memory data, when an erasure pulse (ERS) is applied to the memory block targeted for data erasure, a positive erasure voltage is applied to the gate of the memory cell having the nonvolatile transistor having the floating gate, thereby erasing the content of the memory.

Figure 14:
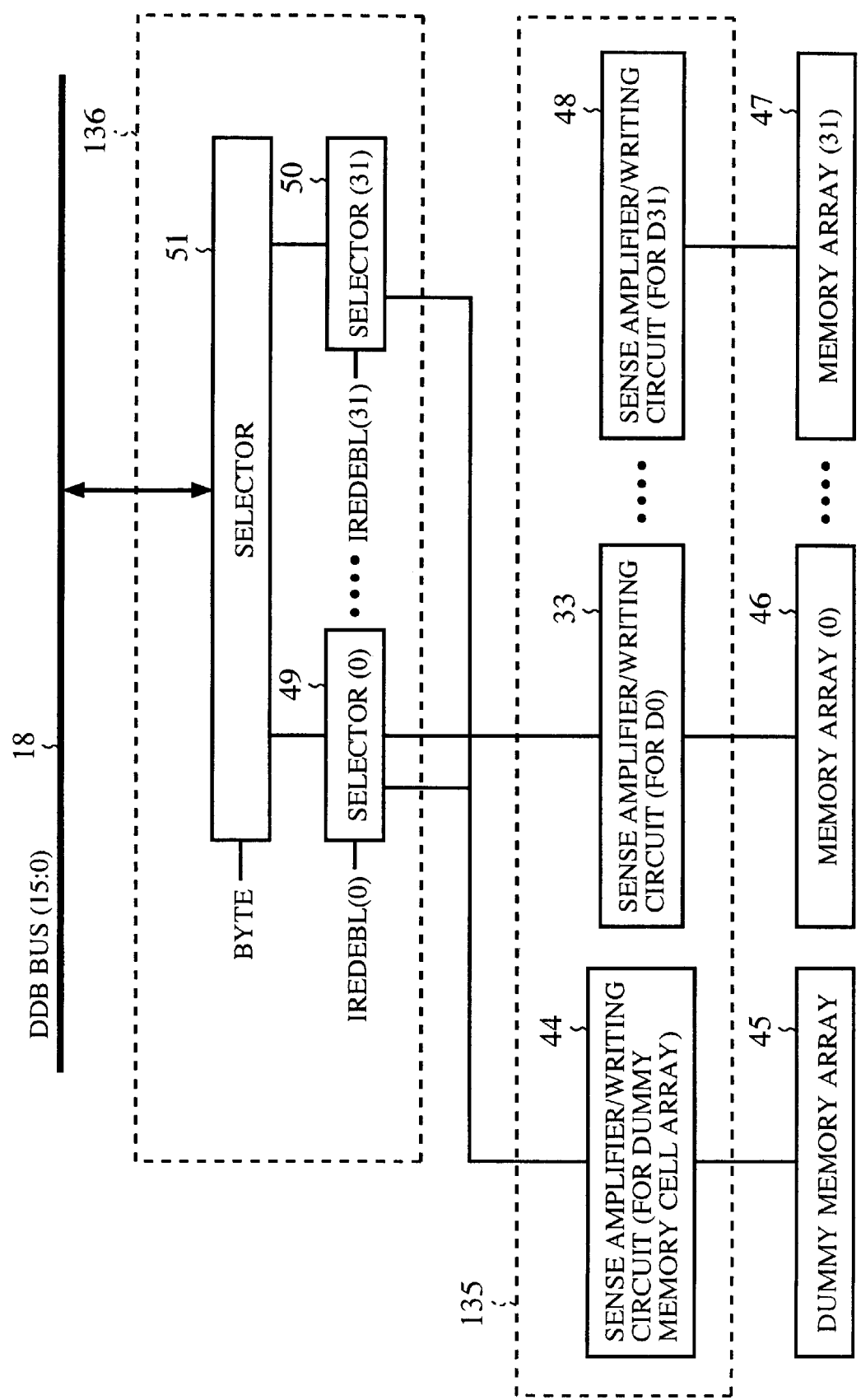
FIG. 14 is a view showing a connection relation among the dummy memory array, a memory array, a sense amplifier/writing circuit, a selector, and a DDB bus.

FIG. 14 shows a connection relation among the dummy memory cell array, the memory arrays (0) to (31), the sense amplifier/writing circuit, the sense amplifier/writing circuits (for D0) to (D31), the selectors (0) to (31), and the DDB (15:0) bus. In the drawing, a reference numeral 135 designates a sense amplifier/writing circuit; 33 designates a sense amplifier/writing circuit (for D0); 48 designates a sense amplifier/writing circuit (D31); 44 designates a sense amplifier/writing circuit (for dummy memory cell); 45 designates a dummy memory array; 46 designates a memory array (0); 47 designates a memory array (31); 49 designates a selector (0); 136 designates a selector circuit; 50 designates a selector (31); and 51 designates a selector (31).

The selector 51 grades memory data at the time of 8 bit accessing or 16 bit accessing, and then output the data to DDB(15:0) bus 18.

The selectors (0) 49 to (31) 50 are selected based on control signals IREDEBL (0) to IREDEBEL (31), and the memory arrays (0) to (31) to be replaced can be replaced by the dummy memory arrays. Here, the selector 51 and the selectors (0) 49 to (31) 50 are collectively called a selector circuit 136.

In addition, the sense amplifier/writing circuits 44 to 48 coupled to one memory cell array are collectively called a 33 bit sense amplifier/writing circuit 135.

Figure 15:
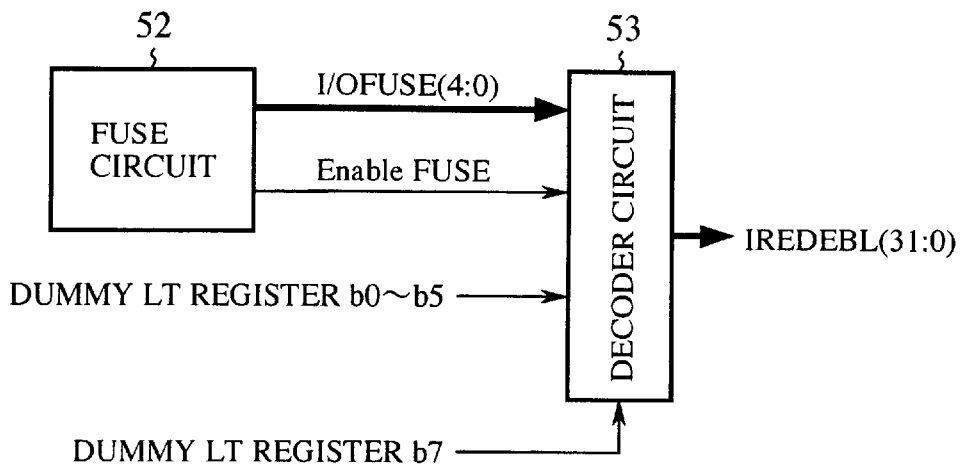
FIG. 15 is a view showing a connection relation between a FUSE circuit and a decoder circuit.

FIG. 15 is a block diagram showing the generation of a control signal IREDEBL(31:0). A reference numeral 52 denotes a FUSE circuit (first means); 53 a decoder circuit (second means); and b0 to b5, and b7 are bits of the dummy LT register (dummy register). The control signal IREDEBL (31:0) is generated at the decoder circuit 53 upon receiving a 5 bit signal I/O FUSE(4:0) from the FUSE circuit 52, an Enable FUSE signal, the output signals of the bits b0 to b5 of the dummy LT register, and the output of the bit b7 of the same. The decoder circuit 53 receives the content of the FUSE circuit preferentially. When the Enable FUSE signal is active, the content of the dummy LT register is ignored, and the content of the FUSE circuit is reflected in the control signal IREDEBL (31:0).

Figure 25A:
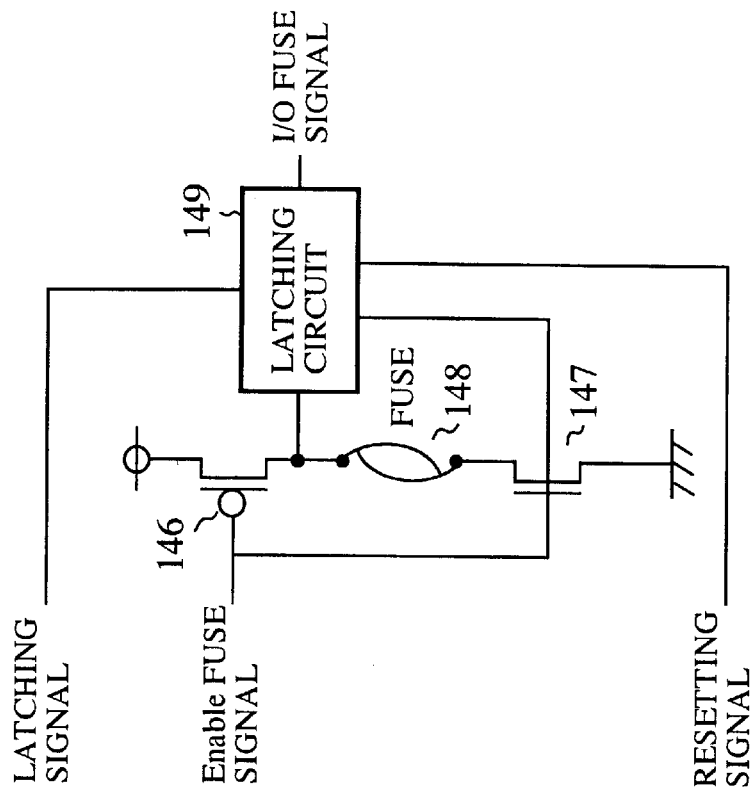
FIGS. 25A and 25B are views respectively showing Enable FUSE signal and I/O FUSE signal generation circuits in the FUSE circuit.
Figure 25B:
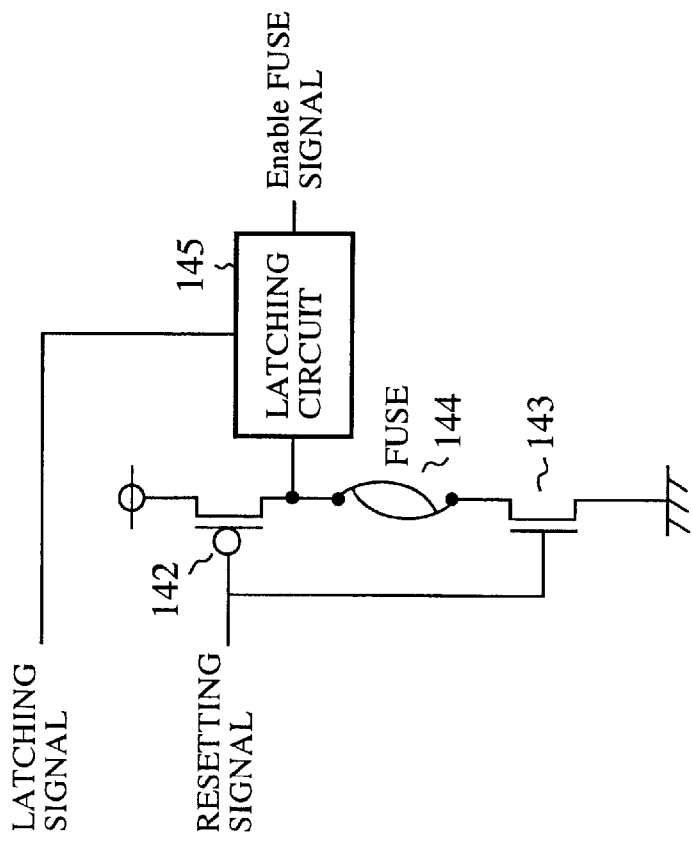
Figure 25C:
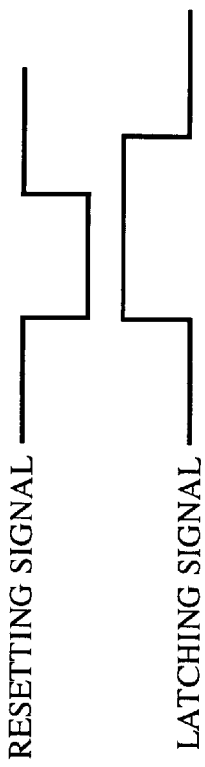
FIG. 25C is a view showing a relation between a resetting signal and a latching signal.

FIGS. 25A and 25B show an Enable FUSE signal generation circuit, and an I/O FUSE signal generation circuit in the FUSE circuit 52, respectively, and FIG. 25C shows a relationship between a resetting signal and a latching signal. In the drawing, reference numerals 142 and 146 each designate a P channel transistor; 143 and 147 each designates an N channel transistors; 144 and 148 each designates a FUSE; and 145 and 149 each designates a latching circuit.

The Enable FUSE signal generation circuit of FIG. 25A includes: a P channel transistor 142, to which a resetting signal is entered; an N channel transistor 143; a FUSE 144 connected to the P and N channel transistors 142 and 143; and a latching circuit 145 connected to the FUSE 144, and the P channel transistor 142. This latching circuit 145 latches data based on a latching signal, and an output thereof is an Enable FUSE signal. There are five I/O FUSE signal generation circuits set in the FUSE circuit 52.

On the other hand, the I/O FUSE signal generation circuit of FIG. 25B includes: a P channel transistor 146, to which an Enable FUSE signal is entered; an N channel transistor 147; a FUSE 148 connected to the P and N channel transistors 146 and 147; and a latching circuit 149 connected to the FUSE 148 and the P channel transistor 146. The latching circuit 149 latches data based on a latching signal, and an output thereof is an I/O FUSE signal. The latching circuit 149 is initialized based on a resetting signal, and the I/O FUSE signal is forcibly set at L level when the Enable FUSE signal is at L level.

The FUSE 144 in the Enable FUSE signal generation circuit, and the FUSE 148 in the I/O FUSE signal generation circuit can be separated or disconnected by laser. The Enable FUSE signal is set at L level after the entry of a resetting signal if the FUSE 144 in the Enable FUSE signal generation circuit is disconnected. The Enable FUSE signal is set at H level after the entry of the resetting signal if the FUSE 144 in the Enable FUSE signal generation circuit is blown or disconnected.

The I/O FUSE signal is set at L level after the entry of the resetting signal when the Enable FUSE signal is at H level, if the FUSE 148 in the I/O FUSE signal generation circuit has not been disconnected. In addition, the I/O FUSE signal is set at H level after the entry of the resetting signal when the Enable FUSE signal is at H level, if the FUSE 148 in the I/O FUSE signal generation circuit has been disconnected.

FIGS. 16A and 16B show a FUSE circuit trimming specification and a dummy LT register trimming specification respectively. For the FUSE circuit trimming, when Enable FUSE=H level and I/O FUSE (4:0)=L level are established, then an IOEDEBL (0) signal becomes active, and the memory cell array (0) 46 shown in FIG. 14 is replaced by the dummy memory cell array 45.

For the dummy LT register trimming specification, if dummy LT register output b5=H level, and dummy LT register outputs b4 to b0=L level are established, then an IOEDEBL (0) signal is active, and the memory cell array (0) 46 shown in FIG. 14 is replaced by the dummy memory cell array 45. The use of this circuit enables virtual replacement to be carried out by setting data in the dummy LT register 13 before trimming is executed in the FUSE circuit.

Figure 24:
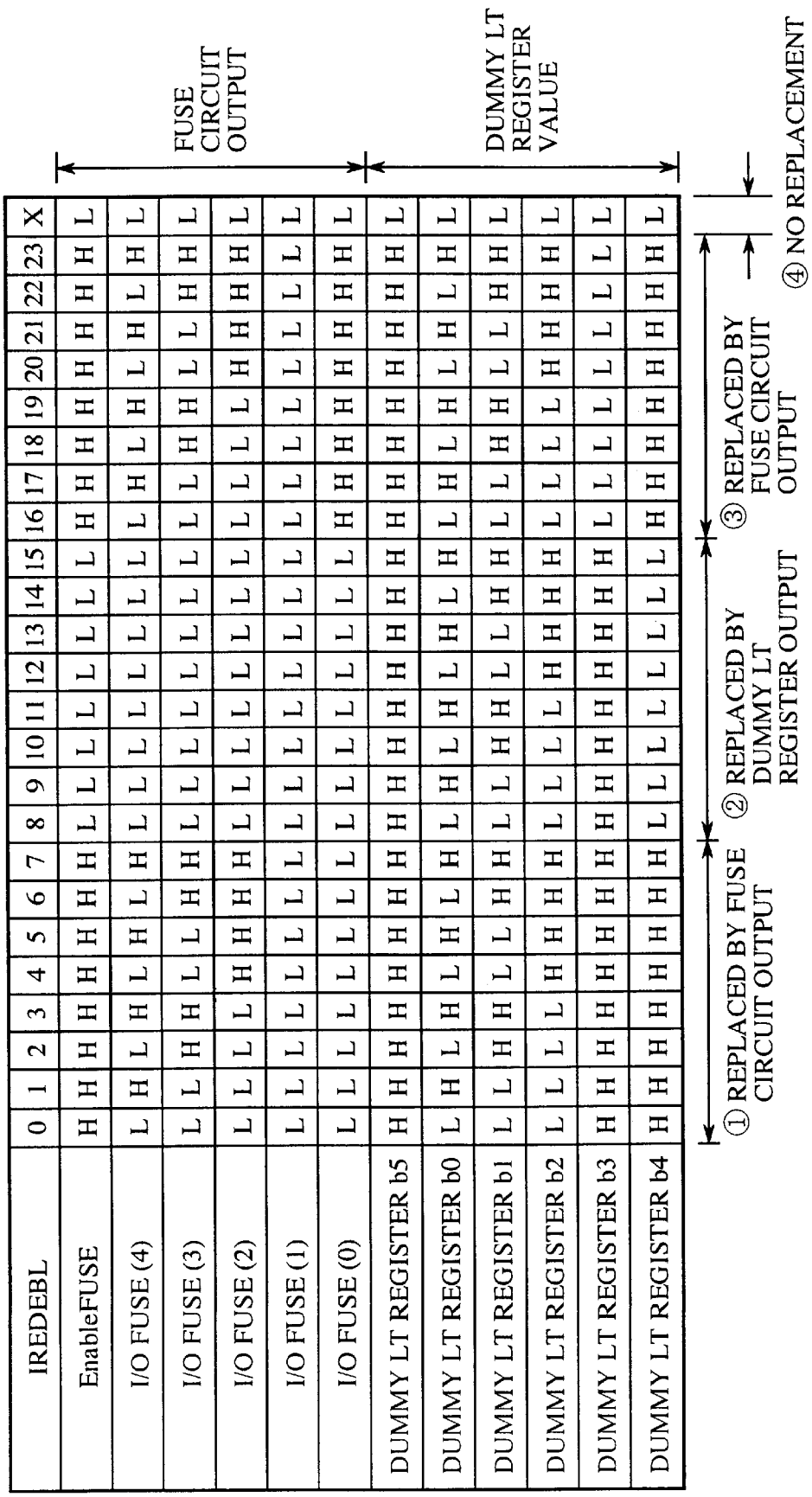
FIG. 24 is a view showing patterns replaced by a dummy LT register and a FUSE circuit.

FIG. 24 shows some examples of patterns to be replaced. First, the pattern 1̂ to be replaced based on the output of the FUSE circuit is described. In the pattern 1̂, the outputs of the FUSE circuit indicate outputs for replacing the memory cell arrays (0) to (7) respectively by the dummy cell arrays. The outputs of the dummy LT register indicate outputs for replacing the memory cell arrays 24 to 31 by the dummy memory cell arrays. However, the decoder circuit 53 receives the content of the FUSE circuit by priority and, when the Enable FUSE signal is active, the content of the dummy LT register is ignored, and the content of the FUSE circuit is reflected in the control signal (31:0). Thus, in the pattern 1, the memory cell arrays (0) to (7) are respectively replaced by the dummy cell arrays.

Next, the pattern $\hat{2}$ to be replaced based on the output of the FUSE circuit is described. In the pattern $\hat{2}$, the outputs of the FUSE circuit indicate no replacement of any memory cells, while the outputs of the dummy LT register indicate outputs for replacing the memory cell arrays (8) to (15) respectively by the dummy memory cell arrays. In this case, the decoder circuit 53 reflects the content of the dummy LT register in the control signal (31:0). Thus, in the pattern $\hat{2}$, the memory cell arrays (8) to (15) are respectively replaced by the dummy memory cell arrays.

Next, the pattern $\hat{3}$ to be replaced based on the output of the FUSE circuit is described. In the pattern $\hat{3}$, the outputs of the FUSE circuit indicate outputs for replacing the memory cell arrays 16 to 23 respectively by the dummy memory cell arrays. The outputs of the dummy LT register also indicate outputs for replacing the memory cell arrays 16 to 23 respectively by the dummy cell arrays. However, the decoder circuit 53 receives the content of the FUSE circuit by priority and, when the Enable FUSE signal is active, the content of the dummy LT register is ignored, and the content of the FUSE circuit is reflected in the control signal IREDEBL (31:0). Thus, in the pattern $\hat{3}$, the memory cell arrays (16) to (23) are replaced by the dummy cell arrays. Lastly, lastly, the pattern $\hat{4}$, in which no memory cells are replaced, is described. In the pattern $\hat{4}$, the outputs of the FUSE circuit and the dummy LT register indicate no replacement of any memory cells. In this case, the decoder circuit 53 replaces no memory cells.

The value of the dummy LT register can be read through the DB (15:0) bus 19 shown in FIG. 2 to the data processor 1. Also, the output value of the FUSE circuit can be read through the dummy LT register 13 and the DB (15:0) bus 19 shown in FIG. 2 to the data processor 1. At the data processor 1, the read two values are compared with each other. Moreover, the value of the dummy LT register is written in the memory block (0) of the memory blocks (5) shown in FIG.1 as data to be written in a flash memory. The written dummy LT register value is read before the FUSE of the FUSE circuit is subjected to laser processing, and which FUSE to be disconnected is decided.

(Operation)

(Automatic Erasure)

Figure 17:
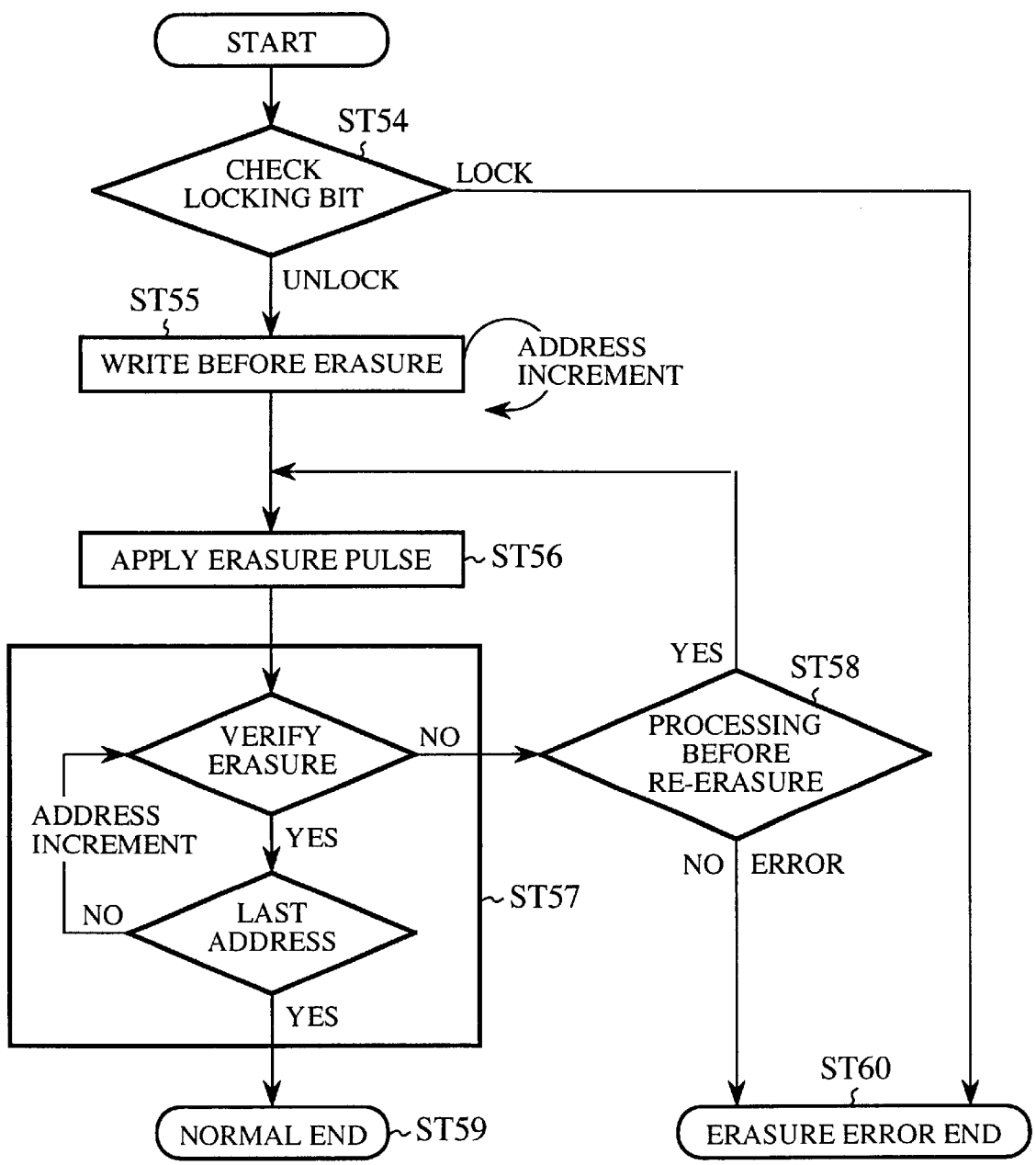
FIG. 17 is a flowchart of automatic erasure.

Next, description will be made of the automatic erasing operation of the nonvolatile semiconductor memory according to the embodiment 1 of the invention by referring to the flowchart of FIG. 17. In the automatic batch erasure of this case, any one of the blocks (0) 28, (1) 29, (2) 30, (3) 31 and (4) 32 is targeted for erasure.

After the entry of a mode, first, ST54 of locking bit checking step is executed. In locking bit checking step ST54, determination is made as to the possibility of reading and erasing the locking bit information of the memory block targeted for erasure. If the result of reading the locking bit information shows a locked state, then processing is finished in erasure error step ST60. If the result shows an unlocked state, the process proceeds to the phase (stage) of next before-erasure writing step ST55. Here, if a forcible erasure mode has been set even when the locked state is determined, the process moves to the phase of the next before-erasure writing step ST55.

In the phase of the before-erasure writing step ST55, the operation of writing data "0" in the memory block targeted for erasure is performed.

In the phase of the before-erasure writing step ST55, data are written by 32-bit unit while sequentially incrementing addresses. After the end of the phase of the before-erasure writing step ST55, the process proceeds to the phase of erasure pulse application step ST56.

In the phase of the erasure pulse application step ST56, an erasure operation is carried out by applying an erasure pulse only to the memory block targeted for erasure. After the end of the phase of the erasure pulse application step ST56, the process proceeds to the phase of erasure verification step ST57.

In the phase of the erasure verification step ST57, erasure verification is carried out for the memory block targeted for erasure while incrementing addresses from the lowermost address to the uppermost address. If a verification failure (defect) occurs in the phase of the erasure verification step ST57, then the process proceeds to the phase of re-erasure preprocessing step ST58 for executing re-erasure.

In the phase of the re-erasure preprocessing step ST58, the number of times of executing re-erasure preprocessing is incremented by 1, and then the process moves again to the phase of the erasure pulse application step ST56.

In the phase of the erasure pulse application step ST56, an erasure operation is performed again. After the end of the erasure pulse application step ST56, the process moves again to the phase of the erasure verification step ST57. In the phase of the erasure verification step ST57, verification is started again from the address, in which the erasure verification failed last time.

In the phases of the erasure pulse application step ST56, the erasure verification step ST57, and the re-erasure preprocessing step ST58, verification is carried out to the last address in the phase of the erasure verification step ST57, or loop processing is continued until the value of the number of times of executing re-erasure preprocessing reaches a maximum value in the phase of the re-erasure preprocessing step ST58.

When the value of the number of times of executing re-erasure preprocessing reaches the maximum value in the phase of the re-erasure preprocessing step ST58, the process ends at erasure error step ST60. If the verification reaches the last address in the phase of the erasure verification step ST57, the automatic erasure process ends at normal end step ST59.

(Timing chart)

Figure 18:
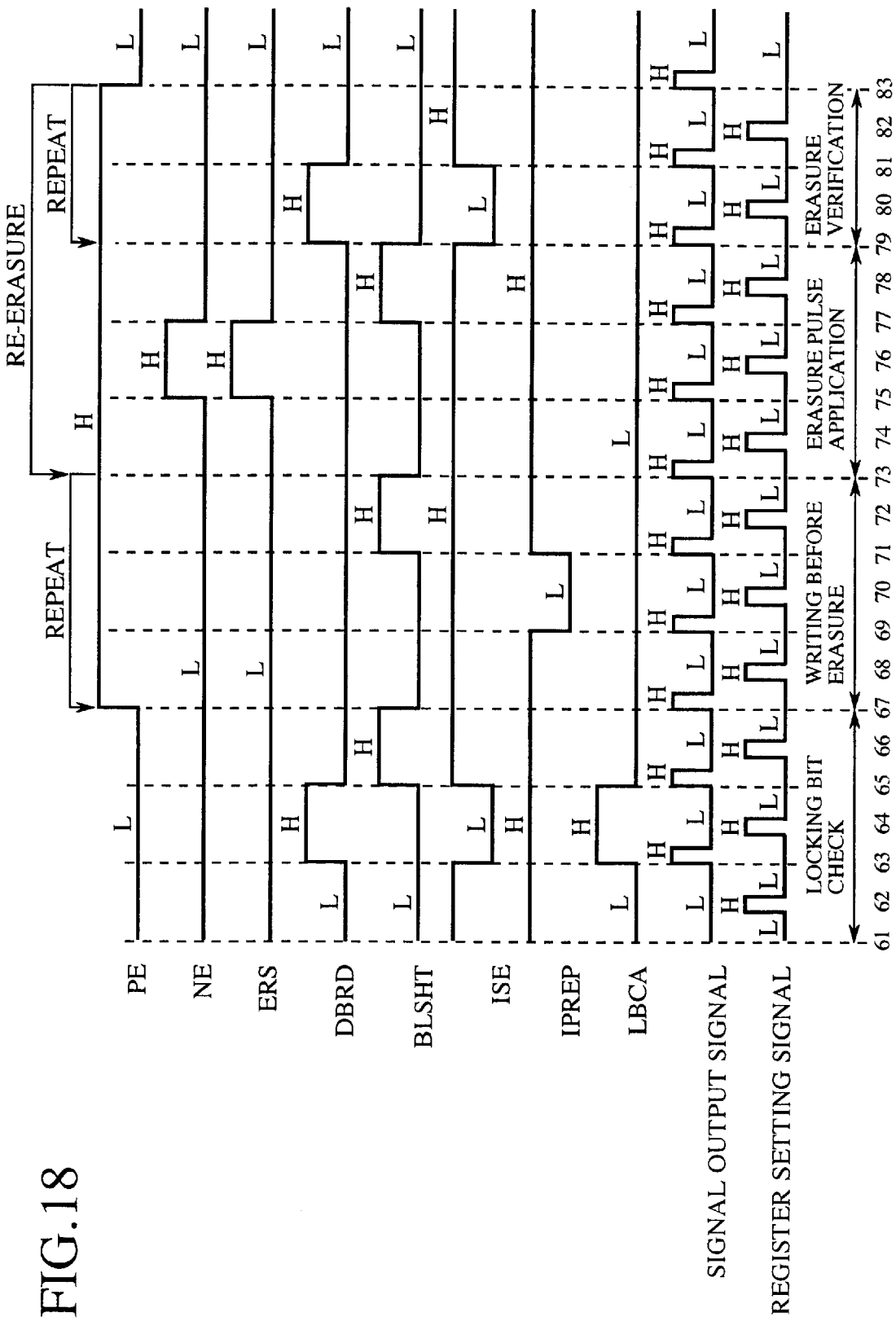
FIG. 18 is a flowchart of automatic erasure.

The description will be next given of the automatic erasure operation of the nonvolatile semiconductor memory of the embodiment 1 of the invention, by referring to the timing chart of FIG. 18, the register circuit group of FIG. 2, the contents of the control signal registers 6(1) and 6(2) for the pump/memory decoder shown in FIG. 4, and the content of the control signal register 6 for the pump/memory decoder shown in FIG. 8. Each signal line shown in FIG. 18 is a signal allocated to each bit of the control signal register 6 for the pump/memory decoder shown in FIG. 4.

First, by the timing 61 of FIG. 18, the automatic erasure operation of the nonvolatile semiconductor memory of the embodiment 1 of the invention is started.

Locking bit checking will be next described. In FIG. 18, the period of locking bit checking is 61 to 67. At the timing 62 of FIG. 18, the value of each signal line is set to the slave side of the register by the timing 62 of FIG. 18, in order to set DBRD and LBCA signals at H level and an ISE signal at L level by the timing 63 of FIG. 18. For the setting of a value in the register, a value is set in the control signal register 6 for the pump/memory decoder shown in FIG. 2 through the DB bus by the data processor 1. At the timing 63 of FIG. 18, by enabling the signal output signal shown in FIG. 8, the DBRD and LBCA signals are set at H level, while the ISE signal is set at L level.

Then, at the timing 64 of FIG. 18, the value of each signal line is set to the slave side of the register by the timing 64 of FIG. 18, in order to set the DBRD and LBCA signals at L level and the ISE and BLSHT signals at H level by the timing 65 of FIG. 18. For the setting of a value in the register, a value is set in the control signal register 6 for the pump/memory decoder shown in FIG. 2 through the DB bus by the data processor 1. At the timing 65 of FIG. 18, by enabling the signal output signal shown in FIG. 8, the DBRD and LBCA signals are set at L level, and the ISE and BLSHT signals at H level.

Then, at the timing 66 of FIG. 18, the value of each signal line of FIG. 18 is set to the slave side of the register, by the timing 66 of FIG. 18, in order to set the BLSHT signal at L level by the timing 67 of FIG. 18. For the setting of a value in the register, a value is set in the control signal register 6 for the pump/memory decoder shown in FIG. 2 through the DB bus by the data processor 1. At the timing 67 of FIG. 18, by enabling the signal output signal shown in FIG. 8, the BLSHT signal is set at L level.

Next, writing before erasure will be described.

In FIG. 18, the period of writing before erasure is 67 to 73. At the timing 68 of FIG. 18, the value of each signal line is set to the slave side of the register by the timing 68 of FIG. 18, in order to set an IPREP signal at L level by the timing 69 of FIG. 18. For the setting of a value in the register, a value is set in the control signal register 6 for the pump/memory decoder shown in FIG. 2 through the DB bus by the data processor 1. At the timing 69 of FIG. 18, by enabling the signal output signal shown in FIG. 8, the IPREP signal is set at L level.

Then, at the timing 70 of FIG. 18, the value of each signal line is set to the slave side of the register by the timing 70 of FIG. 18, in order to set the IPREP and BLSHT signals at H level by the timing 71 of FIG. 18. For the setting of a value in the register, a value is set in the control signal register for the pump/memory decoder shown in FIG. 2 through the DB bus by the data processor 1. At the timing 71 of FIG. 18, by enabling the signal output signal shown in FIG. 8, the IPREP and BLSHT signals are set at H level.

Then, at the timing 72 of FIG. 18, the value of each signal line is set to the slave side by the timing 72 of FIG. 18, in order to set the BLSHT signal at L level by the timing 73 of FIG. 18. For the setting of a value in the register, a value is set in the control signal register 6 for the pump/memory decoder shown in FIG. 2 through the DB bus by the data processor 1. At the timing 73 of FIG. 18, by enabling the signal output signal shown in FIG. 8, the BLSHT signal is set at L level.

Next, erasure pulse application and erasure verification are described. In FIG. 18, the period of erasure pulse application is 73 to 79. The period of erasure verification is 79 to 83. At the timing 74 of FIG. 18, the value of each register is set to the slave side of the register by the timing 74 of FIG. 18, in order to sets NE and ERS signals at H level by the timing 75 of FIG. 18. For the setting of a value in the register, a value is set in the control signal register 6 for the pump/memory decoder shown in FIG. 2 through the DB bus by the data processor 1. At the timing 75 of FIG. 18, by enabling the signal output signal shown in FIG. 8, the NE and ERS signals are set at H level.

Then, at the timing 76 of FIG. 18, the value of each signal line is set to the slave side of the register by the timing 76 of FIG. 8, in order to set the NE and ERS signals at L level, and the BLSHT signal at H level by the timing 77. For the setting of a value in the register, a value is set in the control signal register 6 for the pump/memory decoder shown in FIG. 2 through the DB bus by the data processor 1. At the timing 77 of FIG. 18, by enabling the signal output signal shown in FIG. 8, the NE and ERS signals are set at L level, and the BLSHT signal is set at H level.

Then, at the timing 78 of FIG. 18, the value of each signal line is set to the slave side of the register by the timing 78 of FIG. 18, in order to set the BLSHT and ISE signals at L level, and the DBRD signal at H level by the timing 79 of FIG. 18. For the setting of a value in the register, a value is set in the control signal register 6 for the pump/memory decoder shown in FIG. 18 through the DB bus by the data processor 1. At the timing 79 of FIG. 18. By enabling the signal output signal shown in FIG. 8, the BLSHT and ISE signals are set at L level, and the DBRD signal is set at H level.

Then, at the timing 80 of FIG. 18, the value of each signal line is set to the slave side by the timing 80 of FIG. 18, in order to set the DBRD signal at L level by the timing 81 of FIG. 18. For the setting of a value in the register, a value is set in the control signal register 6 for the pump/memory decoder shown in FIG. 2 through the DB bus by the data processor 1. At the timing 80 of FIG. 18, by enabling the signal output signal shown in FIG. 18, the DBRD signal is set at L level.

In the period of erasure verification, processing is repeated until verification fails or the maximum address of the memory block targeted for erasure is reached. If the maximum address is reached, the value of each signal line is set to the slave side by the timing 82 of FIG. 18, in order to set a PE signal at L level by the timing 83 of FIG. 18. For the setting of a value in the register, a value is set in the control signal register 6 for the pump/memory decoder shown in FIG. 2 through the DB bus by the data processor 1. At the timing 82 of FIG. 18, by enabling the signal output signal shown in FIG. 18, the PE signal is set at L level. If erasure verification fails, then the process returns to the timing 73 to apply erasure pulse.

FIG. 18 shows the register setting signal and the signal output signal. The setting of a value in the register is carried out by using the register setting signal. An output is made from each signal line by using the signal output signal.

(Automatic Writing)

Figure 19:
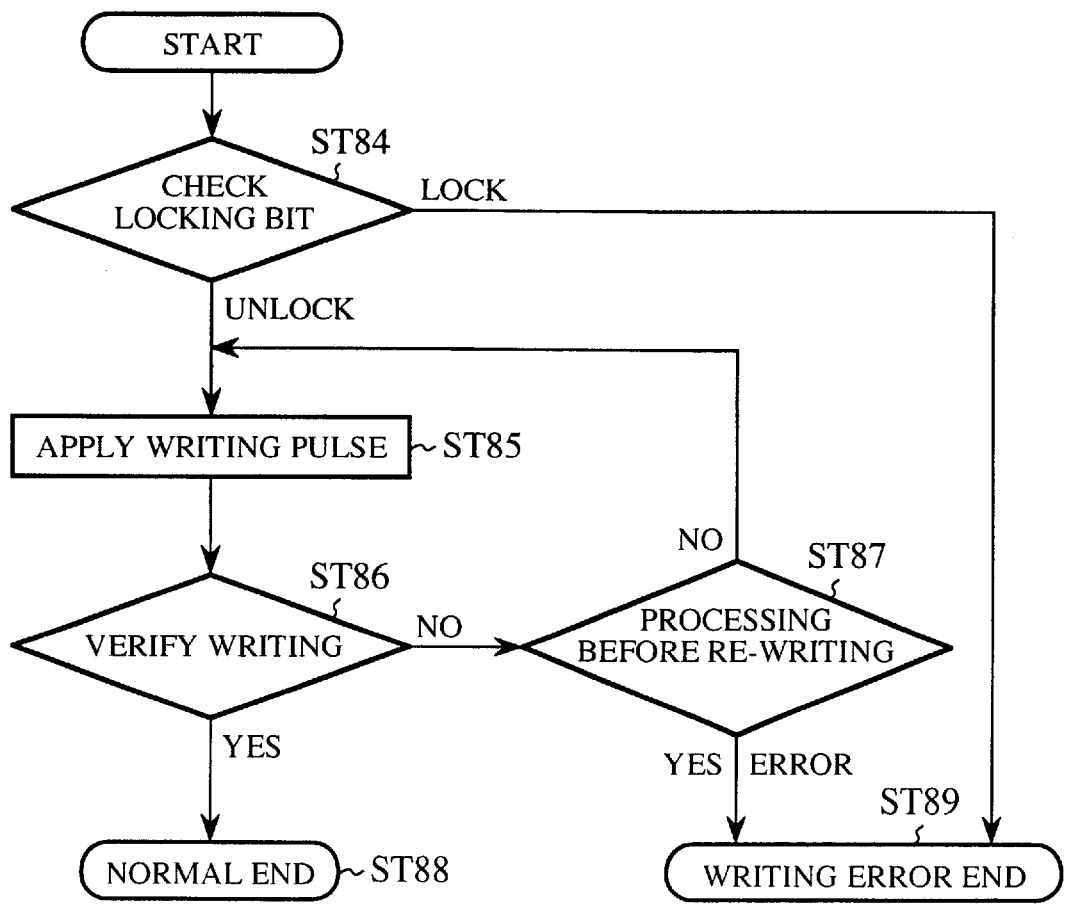
FIG. 19 is a flowchart of automatic writing.

Next, description will be made of the automatic writing operation of the nonvolatile semiconductor memory of the embodiment 1 of the invention by referring to the flowchart of FIG. 19.

After the entry of a mode, first, locking bit checking step ST84 is carried out. In the locking bit checking, the locking bit information of the memory block targeted for writing is read, and determination is made as to the possibility of writing. On the forcible writing mode, automatic writing is performed without using the locking bit information.

On the non-forcible writing mode, the process ends at writing error step ST89. In the phase of writing pulse application step ST85, a writing pulse is applied in accordance with fetched written address and data. After the application of the pulse, the process proceeds to writing verification step ST86. In the phase of the writing verification step ST86, after the application of the writing pulse, the written address data is read, and compared with externally fetched data. This comparison is executed by a word unit. If the comparison shows non-coincidence even by 1 bit, the process moves to the phase of re-writing preprocessing step ST87 for performing writing again. If the comparison shows coincidence among all the data, then the process ends at normal processing step ST88. In the phase of the re-writing preprocessing step ST87, the value of a counter for counting the number of times of writing is incremented by +1. In addition, a bit, in which writing failed, is specified, and the process moves to the writing pulse application step ST85 for applying a writing pulse again. When the counter value of the number of times of writing reaches a maximum value, then the process ends at writing error step STS9.

(Timing Chart)

Next, description will be made of the automatic writing operation of the nonvolatile semiconductor memory of the embodiment 1 of the invention, by referring to the timing chart of FIG. 20, the register circuit group 2 of FIG. 2, the contents of the control signal registers 6(1) and 6(2) for the pump/memory decoder shown in FIG. 4, and the content of the control signal register 6 for the pump/memory decoder shown in FIG. 8. Each signal line shown in FIG. 20 is one allocated to each bit of the control signal register 6 for the pump/memory decoder shown in FIG. 4.

First, by the timing 90 of FIG. 20, the automatic writing operation of the nonvolatile semiconductor memory of the embodiment 1 of the invention is started.

Next, locking bit checking is described.

In FIG. 20, the period of locking bit checking is 90 to 96. At the timing 91 of FIG. 20, a value of each signal line is set to the slave side of the register by the timing 91 of FIG. 20, in order to set the DBRD and LBCA signals at H level, and the ISE signal at L level by the timing 92 of FIG. 20. For the setting of a value in the register, a value is set in the control signal register 6 for the pump/memory decoder shown in FIG. 2 through the DB bus by the data processor 1. At the timing 92 of FIG. 20, by enabling the signal output signal shown in FIG. 8, the DBRD and LBCA signals are set at H level, and the ISE signal at L level.

Then, at the timing 93 of FIG. 20, the value of each signal line is set to the slave side of the register by the timing 93 of FIG. 20, in order to set the DBRD and LBCA signals at L level, and the ISE and BLSHT signals at H level by the timing 94 of FIG. 20. For the setting of a value in the register, a value is set in the control signal register 6 for the pump/memory decoder shown in FIG. 2 through the DB bus by the data processor 1. At the timing 94 of FIG. 20, by enabling the signal output signal shown in FIG. 8, the DBRD and LBCA signals are set at L level, and the ISE and BLSHT signals are set at H level.

Then, at the timing 95 of FIG. 20, the value of each signal line is set to the slave side of the register by the timing 95 of FIG. 20, in order to set the BLSHT signal at. L level, and the PE signal at H level by the timing 96 of FIG. 20. For the setting of a value in the register, a value is set in the control signal register 6 for the pump/memory decoder shown in FIG. 2 through the DB bus by the data processor 1. At the timing 96 of FIG. 20, by enabling the signal output signal shown in FIG. 8, the BLSHT signal is set at L level, and the PE signal is set at H level.

Next, writing pulse application and writing verification are described.

In FIG. 20, the period of writing pulse application is 96 to 103. The period of writing verification is 102 to 106. At the timing 97 of FIG. 20, the value of each signal line is set to the slave side of the register by the timing 97 of FIG. 20, in order to set a PGM signal at H level by the timing 98 of FIG. 20. For the setting of a value in the register, a value is set in the control signal register 6 for the pump/memory decoder shown in FIG. 2 through the DB bus by the data processor 1. At the timing 98 of FIG. 20, by enabling the signal output signal shown in FIG. 8, the PGM signal is set at H level.

Then, at the timing 99 of FIG. 20, the value of each signal line is set to the slave side of the register by the timing 99 of FIG. 20, in order to set the PGM signal at L level by the timing 100 of FIG. 20. For the setting of a value in the register, a value is set in the control signal register 6 for the pump/memory decoder shown in FIG. 2 through the DB bus by the data processor 1. At the timing 100 of FIG. 20, by enabling the signal output signal shown in FIG. 8, the PGM signal is set at L level.

Then, at the timing 101 of FIG. 20, the value of each signal line is set to the slave side of the register by the timing 101 of FIG. 20, in order to set the ISE signal at L level, and the DBRD signal at H level by the timing 102 of FIG. 20. For the setting of a value in the register, a value is set in the control signal register 6 for the pump/memory decoder shown in FIG. 2 through the DB bus by the data processor 1. At the timing 102 of FIG. 20, by enabling the signal output signal shown in FIG. 8, the ISE signal is set at L level, and the DBRD signal is set at H level.

Then, at the timing 103 of FIG. 20, the value of each signal line is set to the slave side of the register by the timing 103 of FIG. 20, in order to set the DBRD signal at L level, and the ISE signal at H level by the timing 104 of FIG. 20. For the setting of a value in the register, a value is set in the control signal register 6 for the pump/memory decoder shown in FIG. 2 through the DB bus by the data processor 1. At the timing 104 of FIG. 20, by enabling the signal output signal shown in FIG. 8, the ISE signal is set at H level, and the DBRD signal is set at L level.

Then, at the timing 105 of FIG. 20, the value of each signal line is set to the slave side of the register by the timing 105 of FIG. 20, in order to set the PE signal at L level by the timing 106 of FIG. 20. For the setting of a value in the register, a value is set in the control signal register 6 for the pump/memory decoder shown in FIG. 2 through the DB bus by the data processor 1. At the timing 106 of FIG. 20, by enabling the signal output signal shown in FIG. 8, the PE signal is set at L level.

If writing verification fails, the process returns to the timing 96 to execute writing pulse application again.

FIG. 20 shows the register setting signal and the signal output signal. The setting of a value in the register is carried out by using the register setting signal. An output from each signal line is made by using the signal output line.

Figure 21:
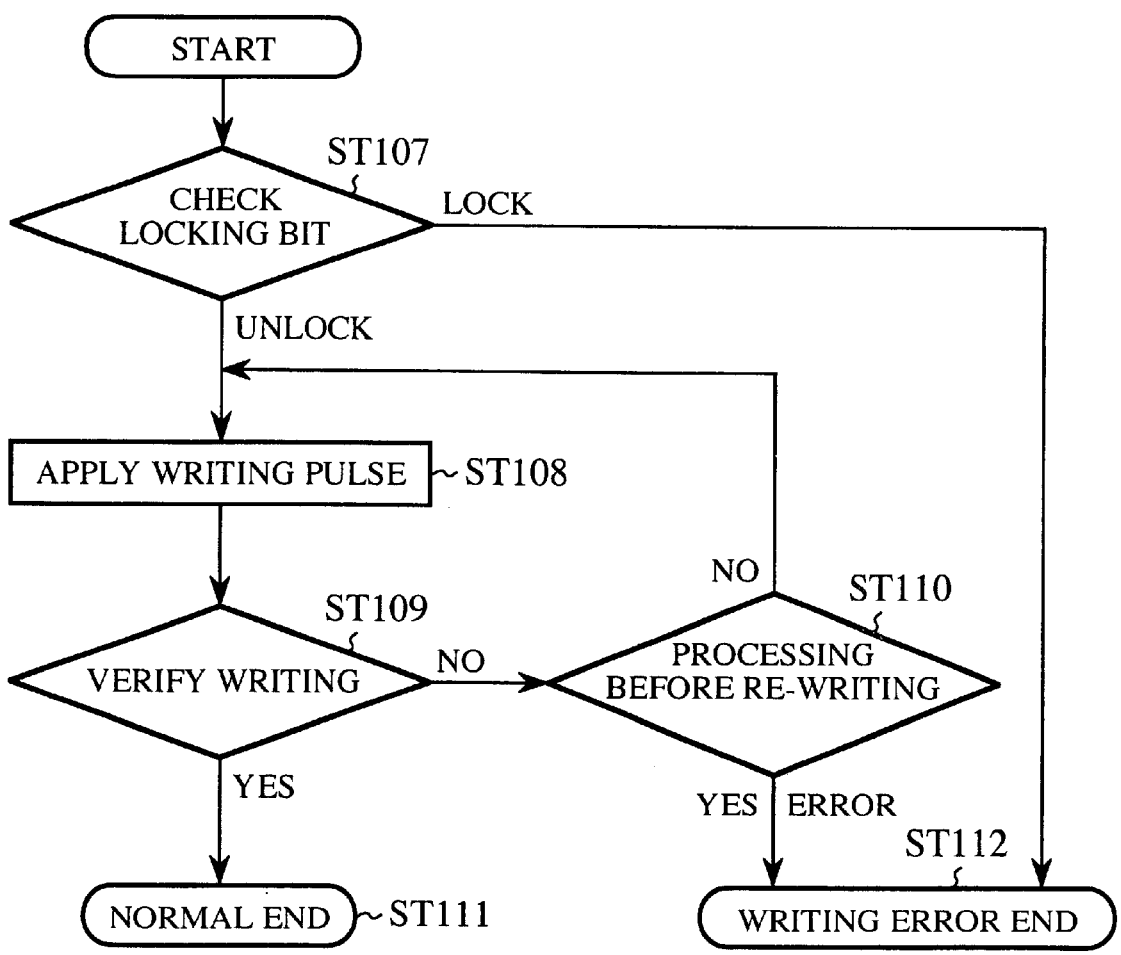
FIG. 21 is a flowchart of locking bit writing.

Next, description will be made of the locking bit program operation of the nonvolatile semiconductor memory of the embodiment 1 of the invention by referring to the flowchart of FIG. 21.

After the entry of a mode, first, locking bit checking step ST107 is executed. In the locking bit checking, the locking bit information of the memory block targeted for writing is read, and determination is made as to the possibility of writing. On the forcible writing mode, automatic writing is carried out without using the locking bit information.

On the non-forcible writing mode, in a locked state, the process ends at writing error end step ST112. In the phase of writing pulse application step ST108, a writing pulse is applied in accordance with fetched address and data. After the application of the writing pulse, the process proceeds to the phase of writing verification step ST109. In the phase of the writing verification step ST109, after the application of the writing pulse, the written locking bit data is read, and compared with written data "0". If non-coincidence is discovered, the process moves to the phase of re-writing preprocessing step ST110 for performing writing again.

If the comparison shows data coincidence, then the process ends at normal end step ST111. In the phase of the re-writing preprocessing step ST110, the value of a counter for counting the number of times of writing is incremented by +1. Then, to apply a writing pulse again, the process moves to the writing pulse application step ST108. When the counter value of the number of times of writing reaches a maximum value, the process ends at writing error step ST112.

(Timing Chart)

Next, description will be made of the locking bit program operation of the nonvolatile semiconductor memory of the embodiment 1 of the invention, by referring to the timing chart of FIG. 22, the register circuit group 2 of FIG. 2, the contents of the control signal registers 6(1) and 6(2) for the pump/memory decoder shown in FIG. 4, and the content of the control signal register 6 for the pump/memory decoder shown in FIG. 8. Each signal line shown in FIG. 8 is one allocated to each bit of the control signal register 6 for the pump/memory decoder shown in FIG. 4.

Figure 22:
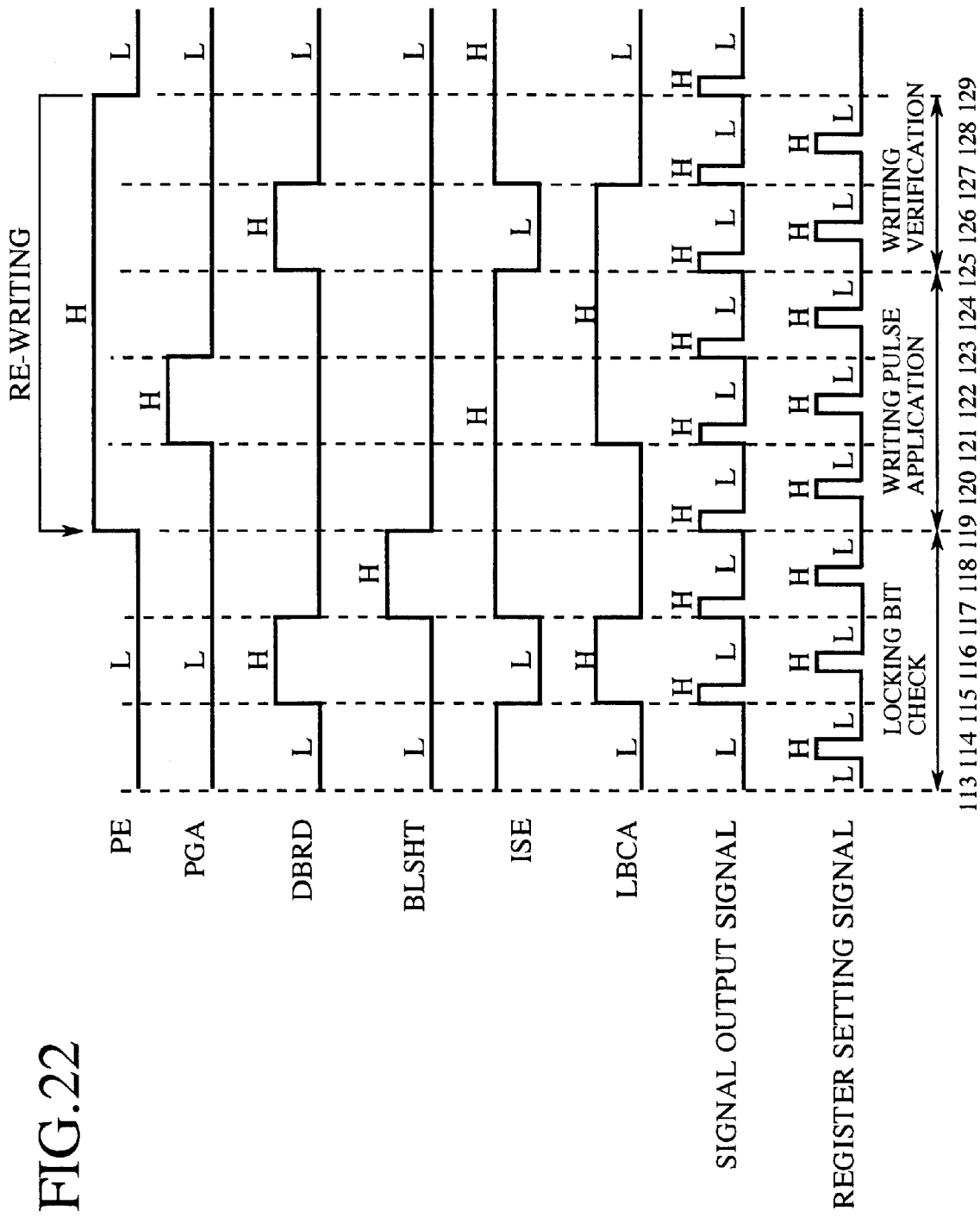
FIG. 22 is a timing chart of locking bit writing.

First, the locking bit program operation of the nonvolatile semiconductor memory of the embodiment 1 of the invention is started by the timing 113 of FIG. 22.

Next, locking bit checking is described. In FIG. 22, the period of the locking bit checking is 113 to 119. At the timing 114 of FIG. 22, the value of each signal line is set to the slave side of the register by the timing 114 of FIG. 22, in order to the DBRD and LBCA signals at H level, and the ISE signal at L level by the timing 115 of FIG. 22. For the setting of a value in the register, a value is set in the control signal register 6 for the pump/memory decoder shown in FIG. 2 through the DB bus by the data processor 1. At the timing 115 of FIG. 22, by enabling the signal output signal shown in FIG. 8, the DBRD and LBCA signals are set at H level, and the ISE signal is set at L level.

Then, at the timing 116 of FIG. 22, the value of each signal line is set to the slave side of the register by the timing 116 of FIG. 22, in order to set the DBDR and LBCA signals at L level, and the ISE and BLSHT signals at H level by the timing 117 of FIG. 22. For the setting of a value in the register, a value is set in the control signal register 6 for the pump/memory decoder shown in FIG. 2 through the DB bus by the data processor 1. At the timing 117 of FIG. 22, by enabling the signal output signal shown in FIG. 8, the DBRD and LBCA signals are set at L level, and the ISE and BLSHT signals are set at H level.

Then, at the timing 118 of FIG. 22, a value of each signal line is set to the slave side of the register by the timing 118 of FIG. 22, in order to set the BLSHT signal at L level, and the PE signal at H level by the timing 119 of FIG. 22. For the setting of a value in the register, a value is set in the control signal register 6 for the pump/memory decoder shown in FIG. 2 through the DB bus by the data processor 1. At the timing 119 of FIG. 22, by enabling the signal output signal shown in FIG. 8, the BLSHT signal is set at L level, and the PE signal at H level.

Next, writing pulse application and writing verification are described. In FIG. 22, the period of writing pulse application is 119 to 125. The period of writing verification is 125 to 129. At the timing 120 of FIG. 22, the value of each signal line is set to the slave side of the register by the timing 120 of FIG. 22, in order to set the PGM and LBCA signals at H level by the timing 121 of FIG. 22. For the setting of a value in the register, a value is set in the control signal register 6 for the pump/memory decoder shown in FIG. 2 through the DB bus by the data processor 1. At the timing 121 of FIG. 22, by enabling the signal output signal shown in FIG. 8, the PGM and LBCA signals are set at H level.

Then, at the timing 122 of FIG. 22, the value of each signal line is set to the slave side of the register by the timing 122 of FIG. 22, in order to set the PGM signal at L level by the timing 123 of FIG. 22. For the setting of a value in the register, a value is set in the control signal register 6 for the pump/memory decoder shown in FIG. 2 through the DB bus by the data processor 1. At the timing 123 of FIG. 22, by enabling the signal output signal shown in FIG. 8, the PGM signal is set at L level.

Then, at the timing 124 of FIG. 22, the value of each signal is set to the slave side of the register by the timing 124 of FIG. 22, in order to set the ISE signal at L level, and the DBRD signal at H level by the timing 125 of FIG. 22. For the setting of a value in the register, a value is set in the control signal register 6 for the pump/memory decoder shown in FIG. 6 through the DB bus by the data processor 1. At the timing 125 of FIG. 22, by enabling the signal output signal shown in FIG. 8, the ISE signal is set at L level, and the DBRD signal is set at H level.

Then, at the timing 126 of FIG. 22, the value of each signal line is set to the slave side of the register by the timing 126 of FIG. 22, in order to set the DBRD and LBCA signals at L level, and the ISE signal at H level by the timing 127 of FIG. 22. For the setting of a signal in the register, a value is set in the control signal register 6 for the pump/memory decoder shown in FIG. 2 through the DB bus by the data processor 1. At the timing 127 of FIG. 22, by enabling the signal output signal shown in FIG. 8, the ISE signal is set at H level, and the DBDR and LBCA signals are set at L level.

Then, at the timing 128 of FIG. 22, the value of each signal line is set to the slave side of the register by the timing 128 of FIG. 22, in order to set the PE signal at L level by the timing 129 of FIG. 22. For the setting of a value in the register, a value is set in the control signal 6 for the pump/memory decoder shown in FIG. 2 through the DB bus by the data processor 1. At the timing 129 of FIG. 22, by enabling the signal output signal shown in FIG. 8, the PE signal is set at L level. If writing verification fails, the process returns to the timing 119 to execute writing pulse application again.

FIG. 22 shows the register setting signal and the signal output signal. The setting of a value in the register is carried out by using the register setting signal, and an output from each signal line is made by using the signal output signal.

(Locking Bit Reading)

(Timing Chart)

Next, description will be made of the locking bit reading operation of the nonvolatile semiconductor memory of the embodiment 1 of the invention will be described by referring to the timing chart of FIG. 23, the register circuit group 2 of FIG. 2, the contents of the control signal registers 6(1) and 6(2) for the pump/memory decoder shown in FIG. 4, and the content of the control signal register 6 for the pump/memory decoder shown in FIG. 8. Each signal line shown in FIG. 18 is one allocated to each bit of the control signal register 6 for the pump/memory decoder shown in FIG. 4.

Figure 23:
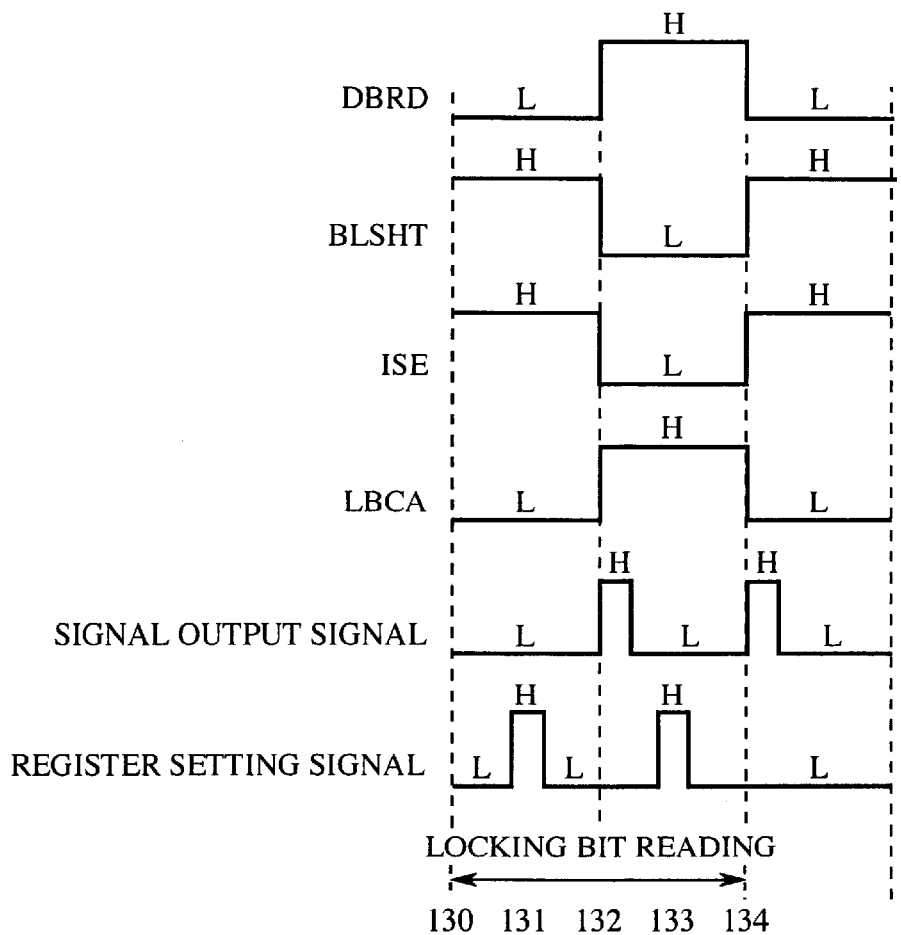
FIG. 23 is a timing chart of locking bit reading.
Figure 26:
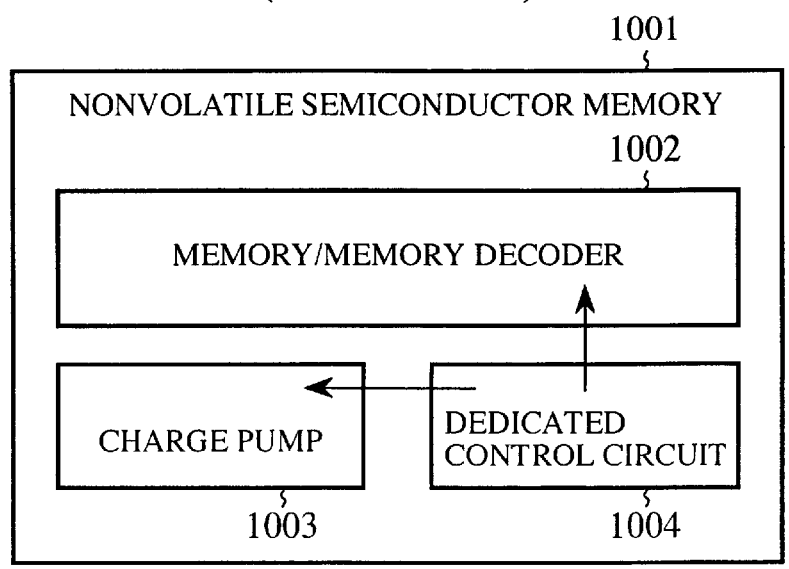
FIG. 26 is block diagram showing a conventional nonvolatile semiconductor memory.

First, by the timing 130 of FIG. 23, the locking bit reading operation of the nonvolatile semiconductor memory of the embodiment 1 of the invention is started.

In FIG. 23, the period of the locking bit reading is 130 to 134. At the timing 131 of FIG. 23, the value of each signal line is set to the slave side of the register by the timing 131 of FIG. 23, in order to set the DBRD and LBCA signals at H level, and the ISE and BLSHT signals at L level by the timing 132 of FIG. 23. For the setting of a value in the register, a value is set in the control signal register 6 for the pump/memory decoder shown in FIG. 2 through the DB bus by the data processor 1. At the timing 132 of FIG. 23, by enabling the signal output signal shown in FIG. 8, the DBDR and LBCA signals are set at H level, and the ISE and BLSHT signals are set at L level.

Then, at the timing 133 of FIG. 23, the value of each signal line is set to the slave side of the register by the timing 133 of FIG. 23, in order to set the DBRD and LBCA signals at L level, and the ISE and BLSHT signals at H level by the timing 134 of FIG. 23. For the setting value in the register, a value is set in the control signal register 6 for the pump/memory decoder shown in FIG. 2 through the DB bus by the data processor 1. At the timing 134 of FIG. 23, by enabling the signal output signal shown in FIG. 8, the DBRD and LBCA signals are set at L level, and the ISE and BLSHT signals are set at H level.

FIG. 23 shows the register setting signal and the signal output signal. The setting of a value in the register is carried out by using the register setting signal, and an output from each signal line is made by using the signal output signal.

As described above, according to the embodiment 1, the automatic erasure/automatic writing/data reading, and so on, of the nonvolatile semiconductor memory are carried out, by using the data processor 1 provided in the same chip as that for the nonvolatile semiconductor memory 101. Accordingly, the dedicated control circuit in the nonvolatile semiconductor memory is made unnecessary, making it possible to reduce the circuit size of entire chip.

Moreover, the dummy register is provided in the nonvolatile semiconductor memory, and the register value is set. Accordingly, the memory array in the memory block composed of the memory array having the plurality of memory cells arranged in the matrix form can be replaced by the dummy memory array.

As described above, according to the invention, the nonvolatile semiconductor memory, comprises: a memory bock composed of a memory array having a plurality of memory cells arranged in a matrix form, each of the memory cells being composed of a nonvolatile transistor; a memory decoder necessary for erasing/writing/reading data of the nonvolatile transistor in the memory array; a charge pump necessary for erasing/writing/reading the data of the nonvolatile transistor in the memory array; a register having each of a plurality of control signals for controlling the memory decoder and the charge pump allocated to register 1 bit; means for updating a content of the register by a data processor coupled to the register; and means for controlling the memory decoder and the charge pump by updating the content of the register. Thus, the content of the register is updated by the data processor coupled to the register having the plurality of control signals for controlling the memory decoder and the charge pump each allocated to register 1 bit, making it possible to control the memory decoder and the charge pump. As a result, without needing any dedicated control circuits, the control of the memory decoder and the charge pump can be realized by small-size hardware configuration.

According to the invention, the nonvolatile semiconductor memory further comprises means for erasing data of the memory block by updating the content of the register with the data processor coupled to the register having the plurality of control signals for controlling the memory decoder and the charge pump, each allocated to register 1 bit. Thus, the memory decoder and the charge pump can be controlled by updating the content of the register and, without needing any dedicated control circuits, the erasure of the data of the memory block can be realized by small-size hardware configuration.

According to the invention, the nonvolatile semiconductor memory further comprises means for writing data in the memory block by updating the content of the register by the data processor coupled to the register having the plurality of control signals for controlling the memory decoder and the charge pump, each allocated to register 1 bit. Thus, the memory decoder and the charge pump can be controlled by updating the content of the register and, without needing any dedicated control circuits, the writing of data in the memory block can be realized by small-size hardware configuration.

According to the invention, the nonvolatile semiconductor memory further comprises means for reading data from the memory block by updating the content of the register by the data processor coupled to the register having the plurality of control signals for controlling the memory decoder and the charge pump, each allocated to register 1 bit. Thus, the memory decoder and the charge pump can be controlled by updating the content of the register and, without needing any dedicated control circuits, the reading of data from the memory block can be realized by small-size hardware configuration.

According to the invention, the automatic erasing method of a nonvolatile semiconductor memory is provided. The nonvolatile semiconductor memory includes: a memory block composed of a memory array having a plurality of memory cells arranged in a matrix form, each of the memory cells being composed of a nonvolatile transistor; a memory decoder necessary for erasing/writing/reading data of the nonvolatile transistor in the memory array; a charge pump necessary for erasing/writing/reading the data of the nonvolatile transistor in the memory array; a register having each of a plurality of control signals for controlling the memory decoder and the charge pump allocated to register 1 bit; and means for updating a content of the register by a data processor coupled to the register. The automatic erasing method comprises the step of: erasing data of the memory block by using the updating means to update the content of the register. Thus, the memory decoder and the charge pump can be controlled by updating the content of the register and, without needing any dedicated control circuits, the erasure of the data of the memory block can be realized by small-size hardware configuration.

According to the invention, the automatic writing method of a nonvolatile semiconductor memory is provided. The nonvolatile semiconductor memory includes: a memory block composed of a memory array having a plurality of memory cells arranged in a matrix form, each of the memory cells being composed of a nonvolatile transistor; a memory decoder necessary for erasing/writing/reading data of the nonvolatile transistor in the memory array; a charge pump necessary for erasing/writing/reading the data of the nonvolatile transistor in the memory array; a register having each of a plurality of control signals for controlling the memory decoder and the charge pump allocated to register 1 bit; and means for updating a content of the register by a data processor coupled to the register. The automatic writing method comprises the step of: writing data in the nonvolatile transistor in the memory block by using the updating means to update the content of the register. Thus, the memory decoder and the charge pump can be controlled by updating the content of the register and, without needing any dedicated control circuits, the writing of data in the memory block can be realized by small-size hardware configuration.

According to the invention, the nonvolatile semiconductor memory comprises: a memory block composed of a memory array having a plurality of memory cells arranged in a matrix form, each of the memory cells being composed of a nonvolatile transistor; a dummy memory array for replacing the memory array; first means for replacing one memory array in the memory block by the dummy memory array, by executing trimming processing; and second means for replacing one memory array in the memory block by the dummy memory array, by setting data in a dummy register, without using a replacing circuit including the dummy memory array. By the second means, the replacement of the memory array by the dummy memory array, carried out by the first means, is executed. Thus, the replacement of the memory array by the dummy memory array can be performed before the replacement of the memory array by the dummy memory array is executed by the first means.

When the replacement of one memory array in the memory block by the dummy memory array is not carried out by the replacing circuit, one memory array in the memory block can be replaced by the dummy memory array, by setting data in the dummy register.

According to the invention, when one memory array in the memory block is replaced by the dummy memory array by the first means, priority is given to the replacement by the first means even if replacement processing by the second means has been set. Thus, the replacement of one memory array in the memory block by the dummy memory array by the first means can be executed.

When the replacement of one memory array in the memory block by the dummy memory array is carried out by the replacing means, even if data has been set in the dummy register, one memory array in the memory block can be replaced by the dummy memory array by the replacing circuit.

According to the invention, information regarding the replacement of one memory array in the memory block by the dummy memory array by the first means, and information regarding the replacement processing by the second means are read, and compared with each other. Thus, verification can be made as to the correct execution of replacement processing by the first means.

According to the invention, a dummy register value set by the replacement processing of the second means is written in the memory cell composed of the nonvolatile transistor, and then read. Thus, even after the power supply voltage of the nonvolatile semiconductor memory is raised, bits of information regarding the replacement processing by the first and second means are read, and compared with each other. Thus, verification can be made as to the correct execution of the replacement processing by the first means.

What is claimed is:

1. A nonvolatile semiconductor memory comprising:
   a memory block composed of a memory array having a plurality of memory cells arranged in a matrix form, each of the memory cells being composed of a nonvolatile transistor;
   a memory decoder necessary for erasing/writing/reading data of the nonvolatile transistor in the memory array;
   a charge pump necessary for erasing/writing/reading the data of the nonvolatile transistor in the memory array;
   a register having each of a plurality of control signals for controlling the memory decoder and the charge pump allocated to register 1 bit;
   means for updating a content of the register by a data processor coupled to the register; and
   means for controlling the memory decoder and the charge pump by a trigger signal from the data processor.

2. The nonvolatile semiconductor memory according to claim 1, further comprising: means for erasing data of the memory block by updating the content of the register.

3. The nonvolatile semiconductor memory according to claim 1, further comprising: means for writing data in the nonvolatile transistor in the memory block by updating the content of the register.

4. The nonvolatile semiconductor memory according to claim 1, further comprising: means for reading data from the nonvolatile transistor in the memory block by updating the content of the register.

5. An automatic erasing method of a nonvolatile semiconductor memory, the nonvolatile semiconductor memory including:
   a memory block composed of a memory array having a plurality of memory cells arranged in a matrix form, each of the memory cells being composed of a nonvolatile transistor;
   a memory decoder necessary for erasing/writing/reading data of the nonvolatile transistor in the memory array;
   a charge pump necessary for erasing/writing/reading the data of the nonvolatile transistor in the memory array;
   a register having each of a plurality of control signals for controlling the memory decoder and the charge pump allocated to register 1 bit; and
   means for updating a content of the register by a data processor coupled to the register, and
   the automatic erasing method comprising the step of:
   erasing data of the memory block by using the updating means to input a trigger signal from the data processor to the register.

6. An automatic writing method of a nonvolatile semiconductor memory, the nonvolatile semiconductor memory including:
   a memory block composed of a memory array having a plurality of memory cells arranged in a matrix form, each of the memory cells being composed of a nonvolatile transistor;
   a memory decoder necessary for erasing/writing/reading data of the nonvolatile transistor in the memory array;
   a charge pump necessary for erasing/writing/reading the data of the nonvolatile transistor in the memory array;
   a register having each of a plurality of control signals for controlling the memory decoder and the charge pump allocated to register 1 bit; and
   means for updating a content of the register by a data processor coupled to the register, and
   the automatic writing method comprising the step of:
   writing data in the nonvolatile transistor in the memory block by using the updating means to input a trigger signal from the data processor to the register.

7. A nonvolatile semiconductor memory comprising:
   a memory block composed of a memory array having a plurality of memory cells arranged in a matrix form, each of the memory cells being composed of a nonvolatile transistor;
   a dummy memory array for replacing the memory array;
   first means for replacing one memory array in the memory block by the dummy memory array, by executing trimming processing;
   second means for replacing one memory array in the memory block by the dummy memory array, by setting data in a dummy register, without using a replacing circuit including the dummy memory array; and means for replacing the memory array by the dummy memory array carried out by the first means, by the second means.

8. The nonvolatile semiconductor memory according to claim 7, further comprising; means for giving priority to the replacement by the first means even if replacement processing by the second means has been set, when one memory array in the memory block is replaced by the dummy memory array by the first means.

9. The nonvolatile semiconductor memory according to claim 7, further comprising: means for reading information regarding the replacement of one memory array in the memory block by the dummy memory array by the first means, and information regarding the replacement processing by the second means, and comparing these bits of information with each other.

10. The nonvolatile semiconductor memory according to claim 7, further comprising: means for writing a dummy register value set by the replacement processing of the second means in the memory cell composed of the nonvolatile transistor, and then reading the dummy register value; and means for reading bits of information regarding the replacement processing by the first and second means, and comparing these bits of information with each other.

* * * * *